(12) United States Patent
Nurmetov et al.

(10) Patent No.: US 12,127,480 B2
(45) Date of Patent: Oct. 22, 2024

(54) ON-SUBSTRATE MECHANICAL STRESS SENSING AND COMPENSATION

(71) Applicant: Texas Instruments Incorporated, Dallas, TX (US)

(72) Inventors: Umidjon Nurmetov, Munich (DE); Ralf Peter Brederlow, Poing (DE); Baher Haroun, Allen, TX (US); Jose Antonio Vieira Formenti, Dallas, TX (US); Michael Szelong, Freising (DE); Tobias Bernhard Fritz, Mainburg (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 460 days.

(21) Appl. No.: 16/932,343

(22) Filed: Jul. 17, 2020

(65) Prior Publication Data
US 2022/0020915 A1    Jan. 20, 2022

(51) Int. Cl.
*G01L 1/18*  (2006.01)
*G01L 1/22*  (2006.01)
*H10N 30/30*  (2023.01)
*H10N 30/80*  (2023.01)

(52) U.S. Cl.
CPC ............ *H10N 30/302* (2023.02); *G01L 1/18* (2013.01); *G01L 1/2268* (2013.01); *H10N 30/802* (2023.02)

(58) Field of Classification Search
CPC ......... H01L 41/1132; G01L 1/16; G01L 1/18; G01L 1/2268; G01L 41/042
See application file for complete search history.

(56) References Cited

U.S. PATENT DOCUMENTS

| | | | | | |
|---|---|---|---|---|---|
| 4,945,762 | A | * | 8/1990 | Adamic, Jr. .......... | G01L 9/0054 73/862.622 |
| 6,522,116 | B1 | * | 2/2003 | Jordan .................... | G05F 1/575 323/299 |
| 7,302,357 | B2 | * | 11/2007 | Ausserlechner ........ | H01L 43/04 324/225 |
| 7,980,138 | B2 | * | 7/2011 | Ausserlechner ........ | G01L 5/162 73/763 |

(Continued)

FOREIGN PATENT DOCUMENTS

DE    102021200720    *    7/2022

*Primary Examiner* — Octavia Davis Hollington
(74) *Attorney, Agent, or Firm* — Michelle F. Murray; Frank D. Cimino

(57) ABSTRACT

In described examples, a circuit includes an analog frontend arranged to generate an analog stress compensating signal in response to a to-be-compensated analog signal and a first-axis stress sensing signal. The analog frontend can comprise a first precision component (e.g., 220) arranged on a piezoelectric material and arranged to generate the to-be-compensated analog signal that is affected by a stress exerted in the piezoelectric material and a directional stress sensor arranged on the piezoelectric material and coupled to the first precision component. The directional stress sensor is arranged to generate the first-axis sensing signal in response to a longitudinal resultant of a stress exerted in the piezoelectric material. A compensating circuit is arranged to generate a compensated output signal in response to the compensating analog signal and to-be-compensated analog signal.

22 Claims, 14 Drawing Sheets

(56) References Cited

U.S. PATENT DOCUMENTS

| | | | | |
|---|---|---|---|---|
| 8,779,777 | B2* | 7/2014 | Irmer | G01R 19/0092 |
| | | | | 324/130 |
| 9,016,135 | B2* | 4/2015 | Huber | G01D 3/0365 |
| | | | | 73/779 |
| 9,766,300 | B2* | 9/2017 | Motz | G01R 33/077 |
| 9,766,749 | B2* | 9/2017 | Pan | G06F 3/04182 |
| 9,910,087 | B2* | 3/2018 | Eagen | G01D 3/08 |
| 9,960,733 | B2* | 5/2018 | Motz | G01L 1/18 |
| 10,103,050 | B2* | 10/2018 | Motz | H01L 21/71 |
| 10,224,812 | B1* | 3/2019 | Sen | H02M 3/157 |
| 10,333,463 | B2* | 6/2019 | Motz | G01L 1/00 |
| 10,352,792 | B2* | 7/2019 | Nurmetov | H01L 27/22 |
| 10,386,250 | B2* | 8/2019 | Ausserlechner | G01D 3/0365 |
| 2005/0162160 | A1* | 7/2005 | Ausserlechner | G01L 5/0047 |
| | | | | 324/251 |
| 2007/0228500 | A1* | 10/2007 | Shimazu | G01B 7/18 |
| | | | | 257/417 |
| 2018/0231424 | A1* | 8/2018 | Nurmetov | H01L 29/84 |
| 2022/0236123 | A1* | 7/2022 | Motz | H01L 22/34 |

* cited by examiner

ON-SUBSTRATE MECHANICAL STRESS SENSING AND COMPENSATION

BACKGROUND

Mechanical stress can affect physical dimensions and properties of electronic devices, which can also change the operating parameters of stressed devices. Stresses applied to a substrate can change the x- and/or y-dimensions of a substrate upon which a device is formed, which in turn can change an operating parameter of the device. Circuitry employed to monitor and help compensate for such mechanical stress tends to increase circuit complexity and/or require complex mathematical calculations during post-processing of the resultant measurements.

SUMMARY

In described examples, a circuit includes an analog frontend arranged to generate an analog stress compensating signal in response to a to-be-compensated analog signal and a first-axis stress sensing signal. The analog frontend can comprise a first precision component (e.g., 220) arranged on a piezoelectric material and arranged to generate the to-be-compensated analog signal that is affected by a stress exerted in the piezoelectric material and a directional stress sensor arranged on the piezoelectric material and coupled to the first precision component. The directional stress sensor is arranged to generate the first-axis sensing signal in response to a longitudinal resultant of a stress exerted in the piezoelectric material. A compensating circuit is arranged to generate a compensated output signal in response to the compensating analog signal and to-be-compensated analog signal.

DETAILED DESCRIPTION

Figure 1A:
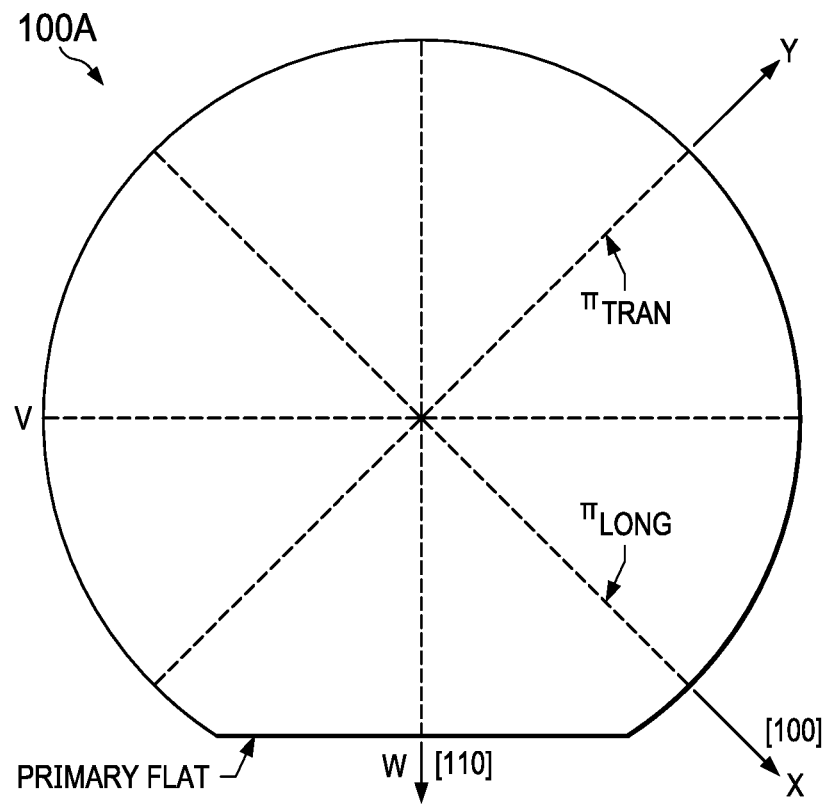
FIG. 1A is a top view of an example semiconductor wafer.

In the drawings, like reference numerals refer to like elements, and the various features are not necessarily drawn to scale.

Continuing advances in semiconductor manufacturing have paced the integration, functionality, and operational speed of electronic devices. The electronic devices include electronic/electrical components (such as resistors and transistors), which can be formed on a semiconductor substrate. At least some advances in the semiconductor manufacturing include using photolithographic processes to form increasingly smaller structures, so that the structures of the electronic devices can be formed using less space on a semiconductor substrate. As such structures become smaller and smaller, the electrical performance of the formed components can be more greatly affected by a given mechanical stress encountered by the semiconductor substrate.

In some examples, an applied mechanical stress affects various parameters of at least some semiconductor components in accordance with the direction in which a mechanical stress is applied. For example, parameters of an operating circuit can change as a function of an orientation of a stress (e.g., force vector) applied to a crystal structure of the semiconductor substrate.

The semiconductor substrate can be a semiconductor wafer (such as a silicon wafer, which can be referred to as a "wafer"), which can be formed by crosswise slicing (e.g., by sawing) a monocrystalline rod (e.g., a boule formed from a crystal seed). During subsequent processing steps performed using the semiconductor wafer, the semiconductor wafer retains a crystalline structure of the monocrystalline rod, so that the semiconductor wafer can exhibit electromechanical properties that are a function of the geometry of the crystalline structure.

A surface of the wafer can include an exposed crystallographic plane of the atoms/molecules arranged (e.g., grown in crystalline form) in the wafer. After a selected wafer surface is exposed, semiconductor devices can be formed on (e.g., including penetrating into) the wafer surface, where the semiconductor devices are aligned on the selected wafer surface with respect to the orientation of crystallographic planes of the semiconductor substrate.

Depending on the substituent material(s) used to form a crystal, the formed three-dimensional crystalline structure of the crystal can include different planes (and axes of crystal alignment). The planes and axes of the formed crystal can be determined by the atomic or molecular properties of the substituent materials selected to grow a crystal. A particular plane in a structure can be denoted using "Miller indices," which are set forth hereinbelow using braces (e.g., curly brackets, such as in the example "{100}").

FIG. 1A is a top view of an example semiconductor wafer. The wafer 100A is an example p-type semiconductor wafer that has been formed to include a primary flat. The primary flat is illustrated in the example as a noncircular (e.g., straight) edge of the wafer 100A. The orientation of the primary flat can be selected in response to a geometrical property of the crystalline structure of the wafer 100A. The primary flat can be used to orient the wafer 100A during various stages of a manufacturing process, so that structures can be directionally formed on (e.g., adjacent to) the wafer with respect to the orientation of the crystalline structure of the wafer. The top surface of the wafer 100A is a {100} plane of the crystalline lattice of the wafer 100A.

The exposed surface (e.g., top surface) of a wafer need not be formed exactly parallel to a {100} plane. Other semiconductor substituents having a suitable geometry (e.g., at the atomic or molecular level) for forming regular crystals having selected combinations of crystallographic planes can be used to form a semiconductor wafer. A regular crystal can be sawn (e.g., sawn in a direction referenced to a selected one of the crystallographic planes) to form wafers, and the wafers can be processed to include dopants of different types (such as n-type or p-type dopants) that are distributed across portions of a wafer (e.g., so that a processed wafer includes electrical components formed with an orientation determined in response to the selected one of the crystallographic planes).

The wafer 100A includes four crystallographic directions or axes, such as V, W, X, and Y. Each of the V, W, X, and Y axes lie within the plane (e.g., parallel with and/or coincident) of the top surface of the wafer 100A. Each of the V, W, X, and Y axes includes an orientation with respect to a geometrical property of the crystalline structure of the wafer 100A.

The orientation of an axis can be described using a three-dimensional point unit vector—such as [xyz]—for describing a target point with respect to an origin (e.g., an origin selected with respect to a geometrical property of the crystalline structure of the wafer 100A). The W axis is oriented perpendicular to the primary flat and coincides with the [110] crystal axis, and the V axis is oriented parallel to the primary flat. The X axis is oriented at an angle of 45 degrees (e.g., in a counterclockwise direction) to the [110] crystal axis and is oriented in parallel (e.g., coincident) with the [100] crystal axis. The Y axis is oriented at an angle of 90 degrees to the X axis. In examples described hereinbelow, various circuit structures are formed having rectilinear features that generally oriented in parallel with or perpendicular to the primary flat of the wafer upon which the various circuit structures are formed.

Various stress sensors (such as piezoelectric devices) are described herein with example references to the [100] crystal axis (other alignments or orientations with respect to various crystal axes are possible). A piezo-resistive coefficient can be denoted herein by "$\pi$" (e.g., the Greek letter pi), where the piezo-resistive coefficient indicates a degree of sensitivity of the resistance to stress applied to a piezo-resistive component along a particular axis. For example, stresses that occur (e.g., stresses that are applied, or resolved to a vector component) along the X axis can be described herein as occurring longitudinal to the [100] crystal axis (e.g., having a first-axis orientation piezo-resistive coefficient of $\pi_{LONG}$), while stresses that occur along the Y axis can be described herein as occurring transverse to the [100] crystal axis (e.g., having a second-axis piezo-resistive coefficient of $\pi_{TRAN}$). Because, for example, not all crystal axes of a an arbitrary crystal lattice are necessarily mutually orthogonal (e.g., and can be orthorhombic or hexagonal), mutually different angles (including orthogonal and/or non-orthogonal angles) are possible between piezo-resistive coefficients (along different axes) and/or selected axes of at two, three, or more stress sensors.

Figure 1B:
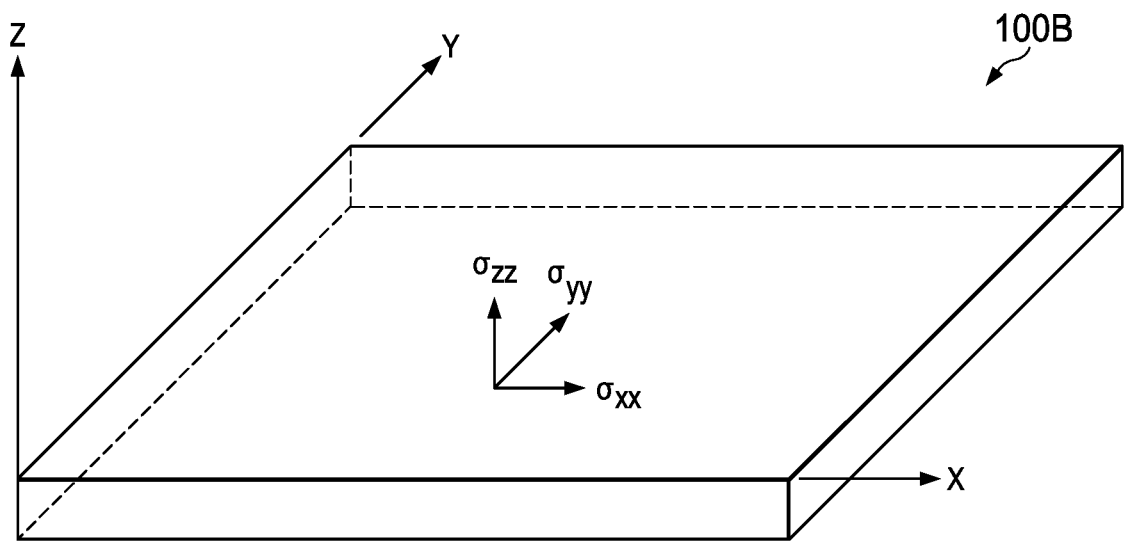
FIG. 1B is an orthographic view of an example section of the example semiconductor wafer of FIG. 1A.

FIG. 1B is an orthographic view of an example section of the example semiconductor wafer of FIG. 1A. The section 100B is an example section that is oriented with respect to the orthogonal X, Y, and Z axes. The X and Y axes extend within (e.g., are parallel with) the plane of the wafer 100A and are oriented as shown in FIG. 1A, whereas the Z axis extends perpendicularly through the plane of the wafer 100A.

Stresses that occur (e.g., are exerted) within the section 100B are denoted directionally herein using the symbol "$\sigma$" (e.g., the Greek letter sigma). Stress can be expressed as a tensor value having six components: three normal stresses (e.g., shown as $\sigma_{xx}$, $\sigma_{yy}$, $\sigma_{zz}$) and three shear stresses (e.g., $\sigma_{XY}$, $\sigma_{XZ}$, $\sigma_{YZ}$, which are not specifically shown herein). The three normal stresses and the three shear stresses can each affect at least one parameter of a performance (e.g., an electrical performance) of a device such as an analog circuit formed on the section 100B (e.g., piezoelectric material).

Generally, each of the normal stresses can be more easily measured than measuring any of the shear stresses because (for example) a packaged integrated circuit chip is generally structured and formed in a layered manner in accordance with the X, Y, and Z axes. For example, the two normal stress components (e.g., $\sigma_{xx}$ and $\sigma_{yy}$) lie in the plane of the wafer 100A and can be measured by respective devices extending longitudinally along the X axis or the Y axis). Also, for example, a normal stress component (e.g., $\sigma_{zz}$) extends perpendicularly to the plane of the wafer 100A and can be measured by a device formed as a "stack" that extends vertically along a Z axis. The shear stress components generally have magnitudes-of-order lower operational effects (e.g., as compared against normal stress operational effects) and can be neglected in various end-use applications.

Figure 1C:
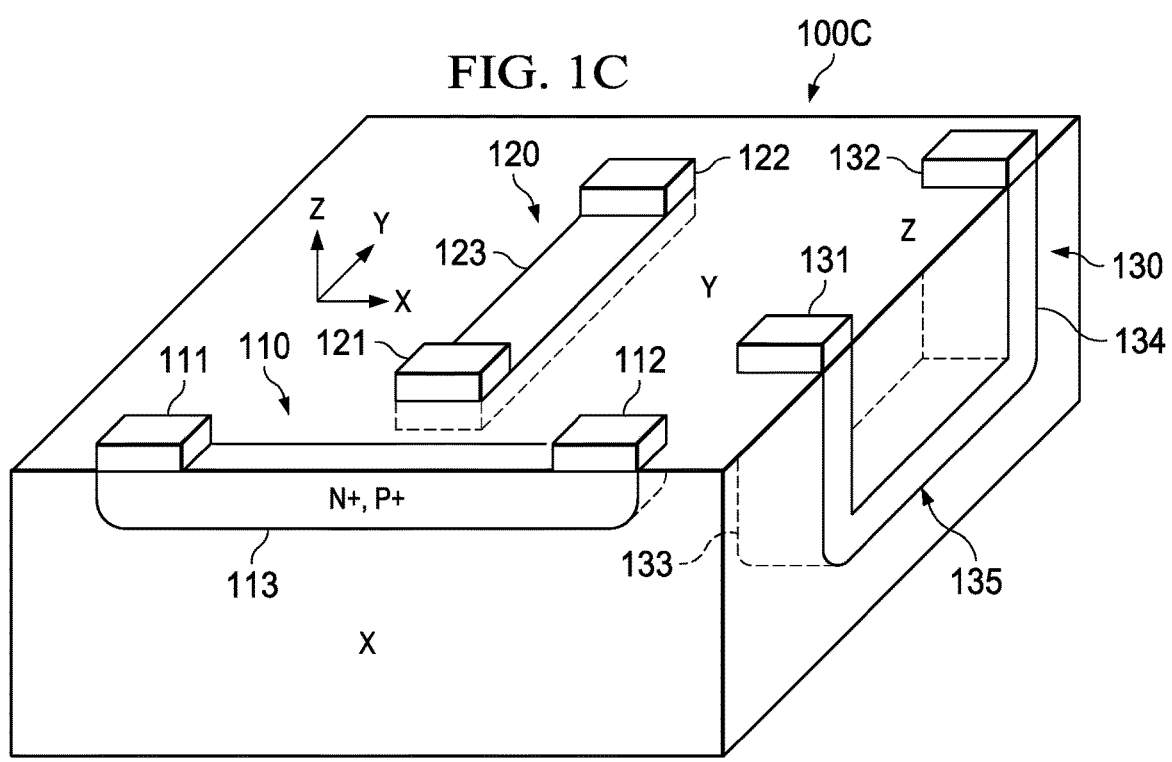
FIG. 1C is an orthographic view of an example section of the example semiconductor wafer of FIG. 1B.

FIG. 1C is an orthographic view of an example section of the example semiconductor wafer of FIG. 1B. The section 100C is an example section of a semiconductor substrate that is oriented with respect to the orthogonal X, Y, and Z axes of the section 100B.

The section 100C includes X element 110, Y element 120, and Z element 130. The X element 110 includes contacts 111 and 112 and a first-axis member 113 (e.g., x-axis member). The Y element 120 includes contacts 121 and 122 and a second-axis member 123 (e.g., y-axis member). The Z element 130 includes contacts 131 and 132, third-axis members 133 and 134 (e.g., z-axis members), and a connecting member 135 (which can include a relatively low resistance as compared against the effective resistances of the third-axis members 133 and 134). The Z element 130 can be arranged so that the connecting member is parallel (as shown) to the second-axis member 123 or so that the connecting member is parallel (not as shown) to the first-axis member 113. Moreover, other orientations of elements (e.g., that are non-orthogonal to the respective orientation of other elements) are possible by combining (for example) second- and third-axis members (e.g., stress-sensing members) within a single directional stress sensor, so that (for example) non-orthogonal stresses (such as shear stresses) can be more accurately detected and compensated for.

Each of first-axis, second-axis, and third-axis members can include N+ and/or P+ dopants such that a channel (e.g., a resistive channel) can be formed in operation. The first-axis member 113 is arranged to change an effective resistance in response to a change of a first-axis stress vector, the second-axis member 123 is arranged to change an effective resistance in response to a change of a second-axis stress vector, and the third-axis members 133 and 134 are each arranged to change an effective resistance in response to a change of a third-axis stress vector. In examples described hereinbelow, a directional stress sensor can include a resistor pair that includes a first-axis N-type resistor that is electrically coupled (e.g., connected) to a second-axis N-type resistor. The resistor pair can be formed on a P-type wafer, so that the first axis is oriented parallel with the X-axis.

Figure 2:
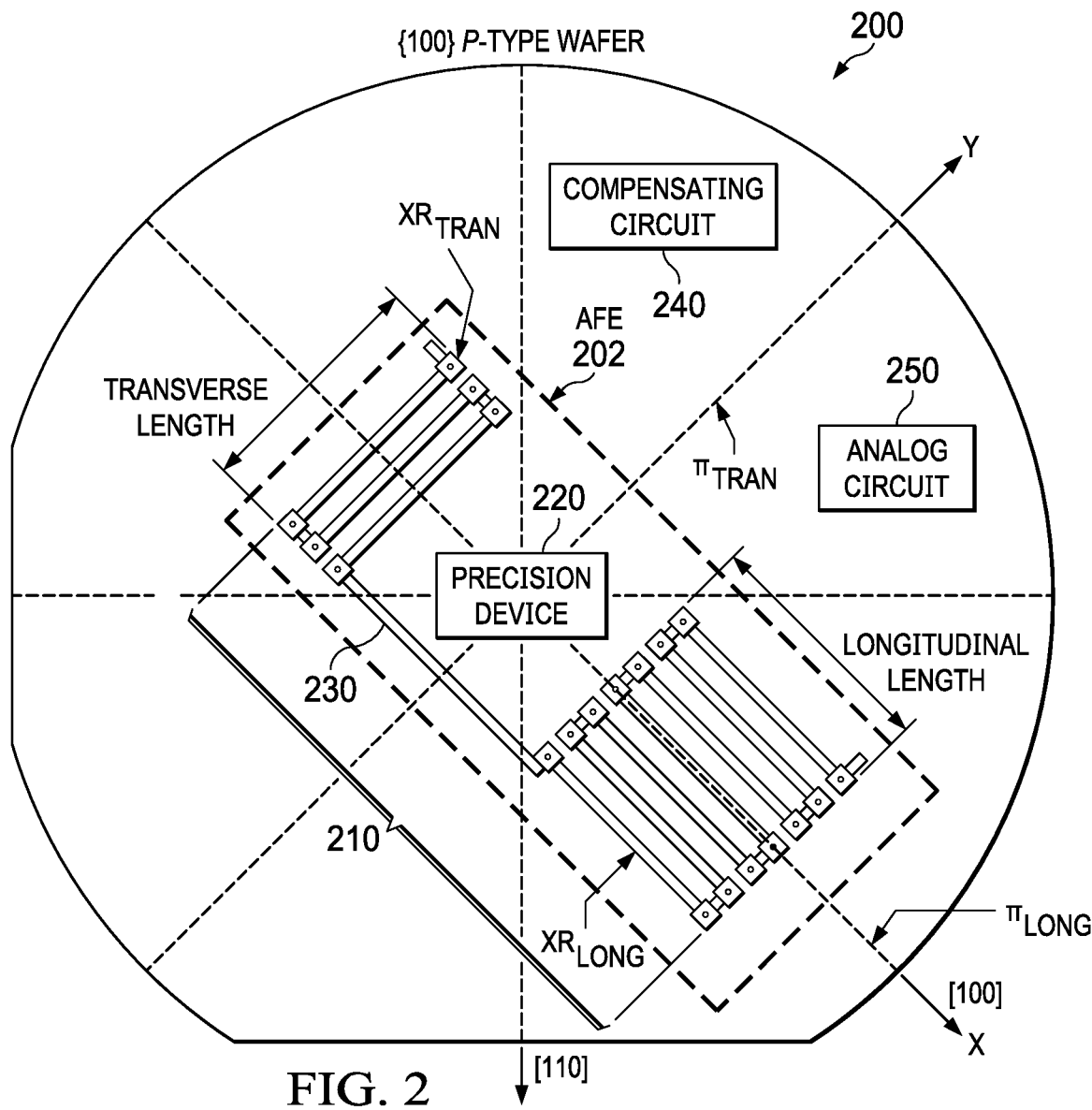
FIG. 2 is a top view of an example wafer, which includes an example first-axis stress sensor.

FIG. 2 is a top view of an example wafer, which includes an example first-axis stress sensor. The wafer 200 includes an analog frontend 202 (AFE), a first-axis stress sensor 210, a precision device 220, a coupler 230, a compensating circuit 240, and an analog circuit 250. Portions (e.g., a partial portion or an entire portion) of the compensating circuit 240 and the analog circuit 250 can be formed amongst and/or between various components of the analog frontend 202 while not necessarily being considered a "part" of the analog frontend 202.

The analog frontend 202 is arranged to generate a first analog compensating signal at a first analog frontend output in response to a precision electrical signal (e.g., which can be a to-be-compensated electrical signal) and a first-axis sensing signal. The precision electrical signal can be an output of the precision device 220 and the first-axis sensing signal can be an output of the first-axis stress sensor 210. Example analog frontends are described hereinbelow with respect to FIG. 4 through FIG. 8.

The first-axis stress sensor 210 is an example stress sensor that includes a set (e.g., pair) of resistors $XR_{TRAN}$ and $XR_{LONG}$ that are coupled in series. The resistors $XR_{TRAN}$ and $XR_{LONG}$ are formed on a surface of the wafer 200, so that $XR_{TRAN}$ and $XR_{LONG}$ are transversely oriented (e.g., orthogonally arranged with respect to each other). The wafer 200 is an example wafer such as wafer 100A.

The first-axis stress sensor 210 includes the resistor $XR_{TRAN}$ and the resistor $XR_{LONG}$, which are coupled in series. The series resistance of the resistor $XR_{TRAN}$ and the resistor $XR_{LONG}$ is arranged to primarily change in response to stress exerted along a first orientation (e.g., along the longitudinal axis, such as the X axis) as compared against primarily changing in response to a second stress that is exerted orthogonally to the first stress (such as a stress exerted along the Y axis). Operation of example sensing resistors is described in commonly assigned U.S. Pat. No. 10,352,792, issued Jul. 16, 2019, entitled "Device and Method for On-Chip Mechanical Stress Sensing," the entirety of which is incorporated herein by reference.

In an example, the resistor $XR_{LONG}$ is a first-axis stress sensing resistor that includes first-axis conductors arranged to conduct a first orientation current that primarily flows longitudinally along the crystal axis [100] (e.g., along the X axis). The resistor $XR_{TRAN}$ is a second-axis stress sensing resistor that includes second-axis conductors arranged to conduct a second orientation current that flows primarily transversely to the crystal axis (e.g., along the Y axis).

As described hereinbelow, the resistor $XR_{LONG}$ and the resistor $XR_{TRAN}$ are coupled in series to generate a change in resistance in response to a force applied along the X axis (e.g., as compared against changing in response to a force applied along the Y axis). In one example, the resistor $XR_{LONG}$ is arranged to include a greater piezo-resistance coefficient with respect to an applied $\sigma_{xx}$ stress force, and the resistor $XR_{TRAN}$ is arranged to include a greater piezo-resistance coefficient with respect to an applied $\sigma_{yy}$ stress force.

The resistor $XR_{LONG}$ can be formed by implanting a low dose of N-type dopants into a number of transverse conductors are aligned to be either longitudinal or transverse to a selected crystal axis (e.g., X axis) and provide a substantially constant resistance along the transverse conductors. The transverse conductors are joined by longitudinal conductors that conduct the current in a direction that is substantially perpendicular to the selected axis but add minimal resistance, so that the overall resistance of resistor $XR_{LONG}$ is a function of (e.g., primarily and/or predominantly dependent upon) a stress exerted parallel to the orientation of transverse conductors. In various examples, the combined lengths of the longitudinal conductors of $XR_{LONG}$ is seven times the combined lengths of the transverse conductors of $XR_{LONG}$. The directions are perpendicular (e.g., substantially perpendicular), for example, when stress-induced effects of first-axis stress sensor 210 are reduced in response to an output signal of the respective directional stress sensor.

The resistor $XR_{TRAN}$ can be formed in a similar manner by which the resistor $XR_{LONG}$ can be formed for example, by selecting an axis (e.g., the Y axis) that is different from the axis (e.g., the X axis) selected for the resistor $XR_{TRAN}$. In various examples, the combined lengths of the transverse conductors of $XR_{LONG}$ is one-seventh the combined lengths of the longitudinal conductors of $XR_{TRAN}$. In various examples, the ratio of the combined lengths of lengths of the transverse conductors of the resistor $XR_{LONG}$ to the combined lengths of the longitudinal conductors of the resistor $XR_{TRAN}$ can be a ratio that is selected in response to a parameter of a sensor that includes the resistor $XR_{LONG}$ and the resistor $XR_{TRAN}$.

In the example, the resistor $XR_{LONG}$ is oriented so that the major direction of current flow in the resistor $XR_{LONG}$ is longitudinal to the <100> crystal axis and the resistor $XR_{TRAN}$ is oriented so that the major direction of current flow in the resistor $XR_{TRAN}$ is transverse to the <100> crystal axis. For N-type resistors implemented in silicon and being oriented to the [100] crystal axis, the longitudinal piezo-resistive coefficient, $\pi_{LONG}$, is −102.2% per GPa and the transverse piezo-resistive coefficient, $\pi_{TRAN}$, is 53.4% per GPa. In various examples, the piezo-resistive coefficients can also be determined by empirical measurements of the response of the respective sensor (e.g., that includes an in-plane resistor) to applied stress vectors.

The respective resistances of resistor $XR_{LONG}$ and resistor $XR_{TRAN}$ vary in response to (e.g., as a function of) the respective piezo-resistive coefficients and both (if present) the longitudinal and transverse stresses). For example:

$$\Delta XR_{LONG} = R \cdot (\pi_{LONG} \cdot \sigma_{XX} + \pi_{TRAN} \cdot \sigma_{YY}) \qquad (1)$$

$$\Delta XR_{TRAN} = R \cdot (\pi_{TRAN} \cdot \sigma_{XX} + \pi_{LONG} \cdot \sigma_{YY}) \qquad (2)$$

where $\Delta XR_{LONG}$ is the change in resistance along the y-axis, $\Delta XR_{TRAN}$ is the change in resistance along the x-axis shown in FIG. 2, and R is the resistance in the resistor when no stress is applied.

In one example, the resistor $XR_{LONG}$ and resistor $XR_{TRAN}$ are selected to be similarly doped and have similar widths, and the ratio between the length of resistor $XR_{LONG}$ and the length of resistor $XR_{TRAN}$ (e.g., $LXR_{LONG}$ divided by $LXR_{TRAN}$) is selected to be equal to a value a (alpha). The value a is selected to be equal to $-1*(\pi_{LONG}/\pi_{TRAN})$, so that, for example, so that the relative lengths of the resistors can be used to cancel the relative stresses encountered on the substrate. In one such example, the value a is selected (e.g., determined) as 53.4/102.2 or about 0.52.

As described hereinabove, resistor $XR_{LONG}$ and resistor $XR_{TRAN}$ are arranged on the piezoelectric material of the wafer 200 as being coupled in series, so that a current flows through both resistor $XR_{LONG}$ and resistor $XR_{TRAN}$, which cooperate to form the first-axis stress sensor 210. Because the resistance for resistors coupled in series can be expressed as a sum of the individual resistances, the resistance along the X-axis for first-axis stress sensor 210 can then be expressed as:

$$\Delta R_{XX} = \alpha \cdot \Delta XR_{LONG} + \Delta XR_{TRAN} \quad (3)$$

By selecting the value of $\alpha$ to reflect the ratio of $\pi_{TRAN}$ to $\pi_{LONG}$, the value of $\sigma_{YY}$ is mathematically cancelled, so that $\Delta R_{XX}$ becomes proportional to $\sigma_{XX}$. In an example implemented in silicon:

$$\Delta R_{XX} = R \cdot (2.914 - 140.78 * 10^{-11} \, Pa^{-1} \cdot \sigma_{XX}) \quad (4)$$

The wafer 200 includes a precision device 220 located (e.g., formed or otherwise situated on a substrate) thereon. The precision device 220 is coupled to the first-axis stress sensor 210 (see X-axis directional stress sensor 440, described hereinbelow with reference to FIG. 4). The precision device 220 includes a precision component, such as a calibrated resistor. The calibrated resistor can be a trimmable and/or trimmed resistor or trimmed semiconductor structure that provides an accurate (e.g., calibrated) electrical quantity, so that the precision component can provide an accurate electrical function for the precision device 220. In an example, a trimmed reference resistor is trimmed (e.g., during packaging or operation) to scale a voltage or current of the directional stress sensor, so that the output current or voltage of the directional stress sensor is calibrated to match (e.g., counter, offset, and/or reduce) the effect(s) of a stress vector upon a performance parameter of a to-be-compensated analog circuit. The precision component is arranged on the piezoelectric material and includes a precision electrical property (e.g., performance parameter) that changes in response to a stress exerted in the piezoelectric material. The accuracy of the precision electrical property can be changed (e.g., adversely affected) by one or more applied stresses to the substrate. As described hereinbelow, the first-axis stress sensor 210 can generate an indication of a directional stress, so that effects of stresses on the precision device 220 can be compensated (e.g., by the compensating circuit 240). The precision device 220 can include an analog circuit 250 (e.g., which can have an operation parameter that can be adversely affected by changes in stress vectors in the piezoelectric material of the wafer 200).

In an example, the analog frontend 202 includes a first-axis stress sensor 210 (e.g., an X-axis stress sensor) that is arranged on the piezoelectric material of the wafer 200 and is coupled to the precision component (e.g., precision device 220). The first-axis stress sensor can be coupled to the precision component to electrically cooperate via an analog signal (e.g., such as the coupling within the Wheatstone bridge of X-axis directional stress sensor 440, described hereinbelow with reference to FIG. 4). The first-axis stress sensor includes a first longitudinal stress sensing resistor (e.g., $XR_{LONG}$) is coupled in series with a first transverse stress sensing resistor (e.g., $XR_{TRAN}$). The first longitudinal stress sensing resistor includes longitudinal conductors arranged longitudinal to the crystal axis and the first transverse stress sensing resistor includes transverse conductors arranged transverse to the crystal axis. A ratio of a resistance of the first stress sensing resistor to the second stress sensing resistor is directly proportional (see, for example, Equations 1 through 3 described hereinabove) to the ratio of the first piezo-resistive coefficient to the second piezo-resistive coefficient. The first-axis stress sensor is arranged to generate a first-axis (e.g., X-axis) sensing signal in response to a first-axis resultant (e.g., longitudinal resultant) of a stress vector exerted in the piezoelectric material. In an example, the ratio of a resistance of the transverse components of the first-axis stress sensor to a resistance of the longitudinal components of the first-axis stress sensor is substantially equal to a ratio of the first piezo-resistive coefficient to the second piezo-resistive coefficient.

In an example described below with reference to FIG. 4, the analog frontend 402 includes a second-axis stress sensor (e.g., a Y-axis stress sensor) arranged on the piezoelectric material of the wafer and arranged to generate a second-axis sensing signal in response to a second-axis resultant of the stress vector exerted in the piezoelectric material. Examples of Y-axis stress sensors are described hereinbelow with respect to FIG. 4, FIG. 5, FIG. 10, and FIG. 12.

In another example (e.g., using the X, Y, and Z elements described hereinabove with respect to FIG. 1C), the analog frontend 402 further includes a third-axis stress sensor (e.g., a Z-axis stress sensor) arranged on the piezoelectric material of the wafer and arranged to further generate a third-axis sensing signal in response to a third-axis resultant of the stress vector exerted in the piezoelectric material.

The one or more applied stresses to the wafer 200 can include stresses generated by heat-generating components in operation and stresses that can be applied after calibrating the precision component (e.g., trimming a trimmable resistor). Stresses that can be applied after such calibration can occur in response to subsequent manufacturing processes, packaging processes, and insertion processes (e.g., mounting on a carrier or printed wiring board). Such stresses can result from relatively ill-fitting packaging components and applied heat (e.g., during soldering) and cooling (e.g., causing contraction of components having different coefficients of expansion), so that the stresses are applied on the substrate from disparate locations per the sources of the stresses.

Stress-induced electrical effects at various locations on a substrate can differ at each location in response to stresses that are applied unevenly across the substrate. For example, stress-induced electrical effects on a first area of a wafer can differ (e.g., differing in magnitude over time and space) from the stress-induced electrical effects on a second area of the wafer. The one or more applied stresses to the substrate can result in localized stress vectors that differ throughout the substrate at the same point in time.

Localized stress vectors that can affect the accuracy of the precision device 220 can be determined by locating (e.g., forming) a portion (e.g., a stress-sensitive portion) of the first-axis stress sensor 210 adjacent to the precision device 220. Locating at least one directional stress sensor (e.g., one or more of first-axis stress sensor 210) adjacent to the precision device 220 permits detecting the magnitude(s) of localized (e.g., particular) stress vectors that adversely affect the accurate operation of the precision device 220. As described hereinbelow (e.g., with reference to FIG. 4 through FIG. 8), the adverse effects of the localized stress vectors upon the precision device 220 can be compensated (e.g., offset or otherwise ameliorated) in response to determining the magnitude of one or more stress vectors (e.g., one or both of the resolved orthogonal stress vectors that locally affect the precision of the operation of the precision device 220).

In various examples, a portion (e.g., an entire portion or a portion less than an entire portion) of the precision device 220 is located (e.g., formed) between a portion of the resistor $XR_{TRAN}$ and a portion of the resistor $XR_{LONG}$, where the resistor $XR_{TRAN}$ and the resistor $XR_{LONG}$ are connected in series by a coupler 230. In an example, the coupler 230 is formed adjacent to the precision device 220. In an example, a portion of the precision device 220 is located adjacent to the first-axis stress sensor 210 within a transverse length of the resistor $XR_{TRAN}$. In an example, a portion of the precision device 220 is located adjacent to the first-axis stress sensor 210 within a longitudinal length of the resistor $XR_{LONG}$. In an example, the resistor $XR_{TRAN}$ and the resistor $XR_{LONG}$ cooperate to generate a stress quantity that indicates (e.g., approximates) a stress quantity encountered by a portion of the precision device 220 that lies between a portion of the resistor $XR_{TRAN}$ and a portion of resistor $XR_{LONG}$.

The wafer 200 includes a compensating circuit 240. In an example, the compensating circuit 240 includes a first input coupled to an output (e.g., for generating a signal that indicates the stress quantity generated by the first-axis stress sensor 210) of the analog frontend 202, a second input coupled to an output of an analog circuit 250 (which can output a signal that can include an operating parameter that is adversely affected by a change in wafer 200 stress vectors), and is arranged to generate a compensated signal at a first output of the compensating circuit in response to the compensating analog signal and an output signal of the analog circuit. Examples of the generation of the compensated output signal are discussed hereinbelow with reference to signal conditioner 420 of FIG. 4, for example.

In various examples, the resistor $XR_{TRAN}$ and the resistor $XR_{LONG}$ cooperate to generate a stress quantity for a selected location of the wafer 200 by sensing localized applied stresses in areas of the wafer 200 that are adjacent to the selected location. In an example, the resistor $XR_{TRAN}$ and the resistor $XR_{LONG}$ cooperate to generate a stress quantity along a notional line that intersects (or is adjacent to, such as within a transverse length or a longitudinal length) a portion of (e.g., a precision component of) the precision device 220.

Localized stress vectors can independently and differently affect each of a plurality of precision devices on a common substrate. In cases where the accuracy of an output of at least one circuit on the wafer depends on the respective accuracies of each of a plurality of precision components, the accuracy of the output can be affected (e.g., adversely affected) by a decrease in an accuracy of any of the plurality of precision devices. As described herein, co-locating a described-herein directional stress sensor to be adjacent to (or otherwise mechanically and/or electrically coupled to) a respective precision component improves the accuracy of an output whose accuracy depends on the accuracy of each respective precision device. Co-locating a respective herein-described directional stress sensor adjacent to each of the precision components relied upon for accuracy allows each of the relied-upon precision components to be individually compensated against the stress affects independently encountered by each of the relied-upon precision components.

Figure 3:
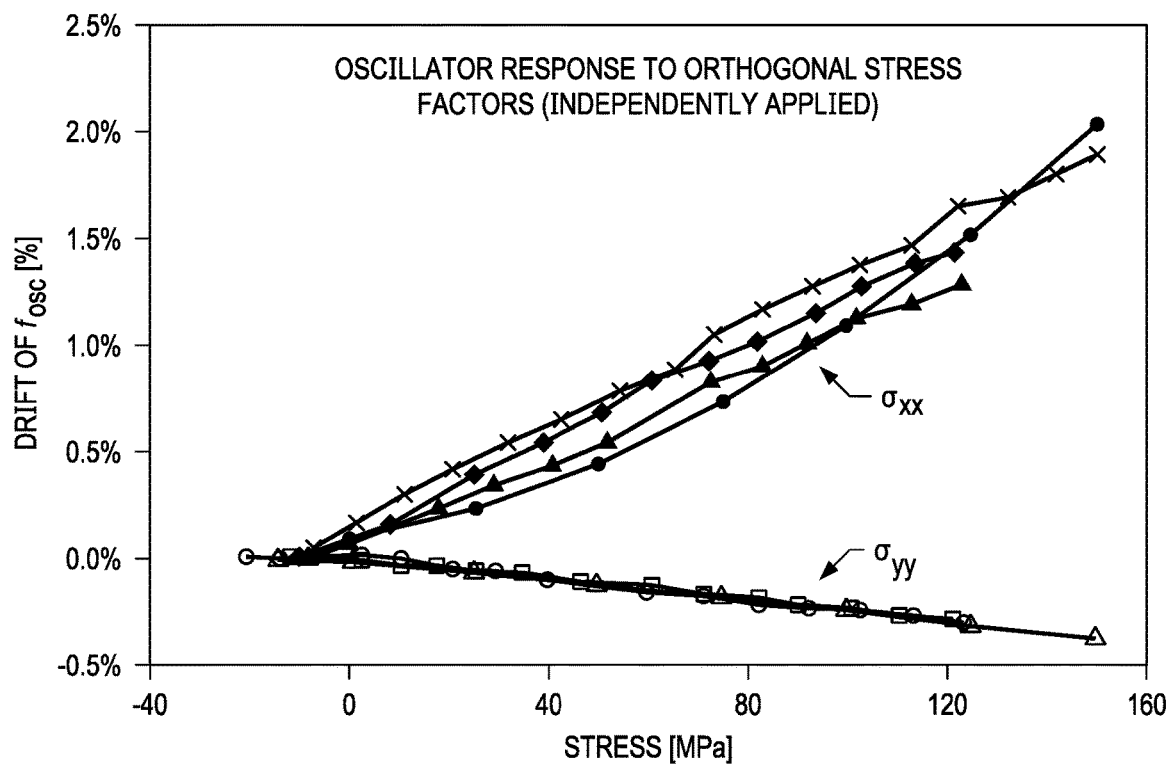
FIG. 3 is an example plot diagram that shows responses of an example circuit to independently applied X-dimension and Y-dimension normal stresses.

FIG. 3 is an example plot diagram that shows responses of an example circuit to independently applied X-dimension and Y-dimension normal stresses. The plot 300 is an example plot from the reference, "Electrical Compensation of Mechanical Stress Drift in Precision Analog Circuits," M. Motz, U. Ausserlechner, Springer, 2016. The plot 300 indicates a percentage drift in output frequency of a resistor/capacitor- (RC-) relaxation oscillator responsive to normal stress applied to the chip (e.g., a portion of a semiconductor wafer) on which the oscillator is structured.

The plot 300 shows resulting differences in percentage of drift as functions of stress independently (e.g., not simultaneously) applied in two orthogonal directions. In the example, the slope of the $\sigma_{xx}$ stresses (e.g., which are applied normal to the X-axis) indicates a circuit response having a substantially disproportionate larger frequency drift as compared against a circuit response shown by the slope of the $\sigma_{yy}$ stresses (e.g., which are applied along the Y-axis). The difference between the slopes of the $\sigma_{xx}$ stress and the $\sigma_{yy}$ stress responses indicates a sensitivity difference to the orthogonally applied (e.g., orthogonally resulting) mechanical stresses. Additionally, the $\sigma_{xx}$ stresses cause a frequency drift in a generally positive direction, whereas the $\sigma_{yy}$ stresses cause a frequency drift in a generally negative direction.

Actual responses of physical circuits to the $\sigma_{xx}$ stresses and the $\sigma_{yy}$ stresses can vary depending on the orientation of the semiconductor design structures and depending on the type and level of doping used to form the semiconductor design structures. Because of the differences in slope and direction of drift (for example) to mechanical stress applied in different directions in the {100} plane, various techniques can be employed to help determine an actual value for each of the $\sigma_{xx}$ stresses and the $\sigma_{yy}$ stresses that can result from a mechanical force applied (e.g., applied from an arbitrary direction) to a stress sensor or stress-sensitive circuit.

In various conventional systems, a separation of the $\sigma_{xx}$ and $\sigma_{yy}$ stress components is performed by sensing the net sum thereof (e.g., as the net sum $\sigma_{xx}+\sigma_{yy}$) and by sensing the net difference therebetween (e.g., as the net difference $\sigma_{xx}-\sigma_{yy}$). Such systems can employ digital signal processing (which are relatively high-complexity circuits) to isolate a value for each of the $\sigma_{xx}$ and $\sigma_{yy}$ stress components and to compensate for stresses applied (e.g., applied in any direction) within the {100} plane. Such systems can require additional power and area of a substrate.

Described herein are example stress-compensating circuits, which are configured to electrically cancel out one (e.g., at least one) of the orthogonal stress components, so that (for example) the stress effects can be compensated for without requiring mathematical calculations to be performed as post-processing functions (e.g., by a digital signal processor). In various examples described herein, the stress-compensating circuits can be configured to generate a stress-conditioned output and/or configured to correct at least one feedback signal responsive to an indication (e.g., directional sensor reading) generated in response to at least one of a pair of orthogonal stress vectors. The example techniques described herein can include stress-sensitive resistors arranged to reduce (if not eliminate) in the analog domain at least one stress component (e.g., $\sigma_{xx}$ or $\sigma_{yy}$) as described hereinbelow.

Figure 4:
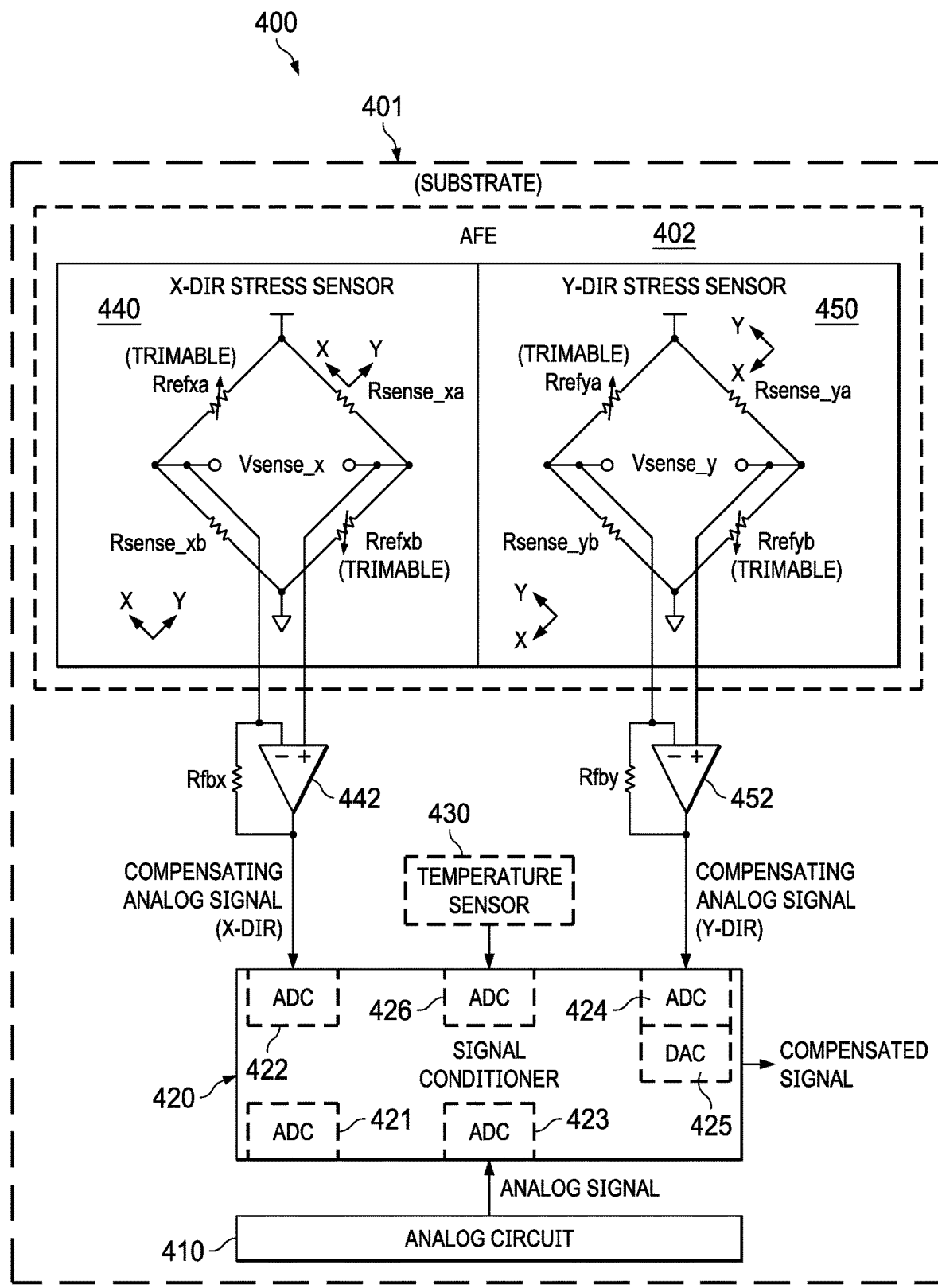
FIG. 4 is a schematic diagram of an example Wheatstone bridge-based analog frontend for stress compensation of analog signals.

FIG. 4 is a schematic diagram of an example Wheatstone bridge-based analog frontend for stress compensation of analog signals. The system 400 is an example system that includes a substrate 401, an analog circuit 410, a signal conditioner 420, a temperature sensor 430, a first-axis directional stress sensor (e.g., X-axis directional stress sensor 440), an optional second-axis directional stress sensor (e.g., Y-axis directional stress sensor 450), operational amplifier 442 and operational amplifier 452 (e.g., that are each configured as double-ended to single-ended converters).

Generally described, the system 400 includes a substrate 401 upon which an analog circuit 410 is arranged. The system 400 is arranged to compensate an analog signal generated by the analog circuit 410, where the analog signal can be affected (e.g., adversely affected) during operation by stresses exerted in the substrate 401. The system 400 includes an analog frontend 402 (AFE) that includes directional stress sensors for sensing the stresses exerted in the substrate 401 and for generating at least one compensating analog signal (e.g., as described hereinabove). The analog frontend 402 includes directional stress sensors (e.g., an X-axis directional stress sensor 440 and a Y-axis directional stress sensor 450) arranged to respectively sense first (e.g., X-axis) and second (e.g., Y-axis) stress vectors in the substrate 401 and to generate a compensating analog signal for each of the sensed stress vectors. The system further includes a signal conditioner 420 (e.g., an analog and/or digital signal compensating circuit) for generating a compensated signal in response to at least one compensating analog signal and in response to an analog signal generated by the analog circuit 410 (e.g., which can be adversely affected in operation by one or more stress vectors). The signal conditioner 420 can be a compensating circuit 240 as described hereinabove.

In various examples, the analog circuit 410 is adjacent to (e.g., formed in and/or formed upon) the substrate 401 and is configured to generate an analog signal. Stresses applied to the substrate 401 can affect the stability of the operation of the analog circuit 410, so that a baseline operation of the analog circuit 410 is affected in response to (e.g., as a function of) a directional force (e.g., stress vector) applied to the substrate 401. The deviation from the baseline operation causes at least one electrical parameter of the generated analog signal to be changed from a baseline value (e.g., a value occurring in a baseline operation) to a deviated value (e.g., a value that occurs in operation during an applied force). The analog circuit 410 can be a circuit such as one or more operational amplifiers, RC (resistor-capacitor) oscillators, bandgap reference voltage generators, analog-to-digital converters (ADCs), digital-to-analog converters (DACs), analog frontends (AFEs), and various sensors (e.g., for sensing temperature, pressure, humidity and other physical quantities).

The signal conditioner 420 is arranged to receive an X-axis compensation signal (e.g., generated by the X-axis directional stress sensor 440), a Y-axis compensation signal (e.g., generated by the Y-axis directional stress sensor 450), and an optional temperature compensation signal (e.g., generated by the temperature sensor 430), where the signal conditioner 420 is arranged to generate a compensated analog signal in response to the received analog signal (e.g., which has a deviated value caused by stress vectors), the directional compensation signals, and optionally the temperature compensation signal. In an example, the compensated signal includes a compensated value that is closer to the baseline value than is the closeness of the deviated value to the baseline value. A compensation signal can be a digital signal (e.g., digitally generated by a processor in response to a sensor reading) or an analog signal (e.g., an analog signal generated in response to a stress sensor).

In an example, the substrate 401 includes a circuit comprising a piezoelectric material, a first-axis stress sensor, a second-axis stress sensor, and a compensating circuit. The piezoelectric material can be included by the substrate 401, so that a flexure (in response to a physical stress) of the substrate 401 flexes the piezoelectric material. The piezoelectric material has a crystal axis (e.g., the X axis), a first piezo-resistive coefficient that is longitudinal to the crystal axis, and a second piezo-resistive coefficient that is transverse to the crystal axis.

The X-axis directional stress sensor 440 includes resistors Rrefxa, Rsense_xb, Rsense_xa and Rrefxb arranged as a Wheatstone bridge for generating a differential signal Vsense_x at intermediate nodes of the first and second branches of the Wheatstone bridge. The differential signal Vsense_x indicates an average of the respectively sensed X-axis stress vectors (e.g., by the resistors Rsense_xa and Rsense_xb) and is resistant to signal interference because of common mode rejection. The resistors Rrefxa and Rsense_xb are coupled in series (in the first branch) between a first power rail (e.g., VCC) and a second power rail (e.g., ground), while the resistors Rsense_xa and Rrefxb are coupled in series (in the second branch) between the first power rail and the second power rail. In various examples, the Rrefxa and Rsense_xb are coupled in series so that a first current flows through both the resistors Rrefxa and Rsense_xb, and the resistors Rsense_xa and Rrefxb are coupled in series so that a second current flows through both the resistors Rsense_xa and Rrefxb.

In an example, a first stress sensor includes a resistors Rrefxa, Rsense_xb, Rsense_xa and Rrefxb. The resistor Rsense_xa is a first x-axis stress sensor that includes a first terminal coupled to a first power rail and a second terminal coupled to a first terminal of the first precision component (e.g., Rrefxa), while first precision component further includes a second terminal that is coupled to a second power rail. The resistor Rsense_xb is a second x-axis stress sensor that includes a first terminal coupled to the second power rail and a second terminal coupled to a first terminal of the second precision component (e.g., Rrefxb), while second precision component further includes a second terminal that is coupled to the first power rail.

Each of the sensing resistors Rsense_xa and Rsense_xb is a directional stress sensor such as the first-axis stress sensor 210 described hereinabove. In an example, the sensing resistor Rsense_xa (of the X-axis directional stress sensor 440) is a first first-axis (e.g., X-axis) directional stress sensor and the sensing resistor Rsense_xb (of the X-axis directional stress sensor 440) is a second first-axis (e.g., X-axis) sensing element. As described hereinbelow with reference to FIG. 12, the sensing resistor Rsense_xa can be arranged as $X1R_{TRAN}$ and $X1R_{LONG}$ in series, while the sensing resistor Rsense_xb can be arranged as $X2R_{TRAN}$ and $X2R_{LONG}$ in series. Each of the directional stress sensor is arranged so that a ratio of a resistance of a first sensing resistor ($X1R_{LONG}$) to the second stress sensing resistor ($X1R_{TRAN}$) is directly proportional to the ratio of the first piezo-resistive coefficient (e.g., piezo-resistive coefficient of $\pi_{LONG}$) to the second piezo-resistive coefficient (e.g., piezo-resistive coefficient of $\pi_{TRAN}$). In an example directional stress sensor, the ratio of a resistance of the second stress sensing resistor (e.g., $X1R_{TRAN}$) to a resistance of the first stress sensing resistor (e.g., $X1R_{LONG}$) is substantially equal to a ratio of the first piezo-resistive coefficient (e.g., along a longitudinal crystal axis) to the second piezo-resistive coefficient (e.g., along a transverse crystal axis). The ratios are substantially equal, for example, when stress-induced effects of the analog circuit 410 are reduced in response to an output signal of the respective directional stress sensor.

The reference resistor Rrefxa can be included by the precision device 1220, while the reference resistor Rrefxb can be included by the precision device 1222. In such a manner, the localized stresses exerted upon each of the reference resistors is individually sensed in response to a direction of each force, so that the stress-induced resistance deviation of each of the reference resistors can be individually and separately compensated.

Each of the reference resistors Rrefxa and Rrefxb can be an example of a precision component. A precision component can be a component such as a trimmable resistor or a trimmable transistor (which can include trimmable "fingers"). In an example, a trimmable resistor can be trimmed (e.g., laser trimmed) before encapsulating the substrate in a package (where the encapsulating material blocks further trimming of the trimmed resistor). The encapsulation and subsequent packaging processes can impart mechanical stresses to the substrate, which can change the resistance of a trimmed resistor (e.g., after a time at which the trimmable resistor is no longer accessible for trimming). The imparted mechanical stresses can be imparted by mounting, soldering, rough handling, thermal cycles, and fluctuating temperatures encountered during operation. Systems and methods described herein (e.g., system 400) can reduce costs, time, and layout area that would otherwise be encountered when attempting to calibrate a precision of a precision component to a precision level at which the precision component was originally calibrated (e.g., calibrated before encapsulating the precision component).

The X-axis directional stress sensor 440 generates the differential signal Vsense_x at intermediate nodes of the first and second branches of the Wheatstone bridge. In an example, the first first-axis stress sensor (e.g., Rsense_xa), the second first-axis stress sensor (e.g., Rsense_xb), the first precision component (e.g., Rrefxa), and the second precision component (e.g., Rrefxb) are arranged as a Wheatstone bridge, wherein the first-axis sensing signal is a first-axis sensing signal differential signal having a first end generated at the second terminal of the first x-axis stress sensor and a second end generated at the first terminal of the second x-axis stress sensor.

In an example, the differential signal Vsense_x can be buffered and/or converted to a single-ended Vsense_x signal by the operational amplifier 442 coupled to the feedback resistor Rfbx. The signal Vsense_x (whether single-ended or differential) is an X-axis compensating analog signal (e.g., for compensating in response to sensing the X-axis resultant of an encountered stress vector). The X-axis compensating analog signal is coupled to the signal conditioner 420 for compensating an output of the analog circuit 410 (as described hereinbelow). In the example, the amplifier (e.g., operational amplifier 442) and the feedback resistor (e.g., feedback resistor Rfbx) are arranged to convert a first-axis sensing signal differential signal to a first-axis sensing signal single-ended signal.

The Y-axis directional stress sensor 450 is optional and can be included for calibration and end-use applications that include determining orthogonal stress vectors. The Y-axis directional stress sensor 450 includes resistors Rrefya, Rsense_yb, Rsense_ya and Rrefyb arranged as a second Wheatstone bridge for generating a differential signal Vsense_y at intermediate nodes of the first and second branches of the second Wheatstone bridge. The Y-axis directional stress sensor 450 operates in a manner similar to the X-axis directional stress sensor 440 although the Y-axis stress sensor is arranged to generate an indication of stress vectors that are exerted on the Y axis of the substrate 401. In an example, the sensing resistor Rsense_xa (of the X-axis directional stress sensor 440) is a first first-axis (e.g., X-axis) directional stress sensor and the sensing resistor Rsense_ya (of the Y-axis directional stress sensor 450) is a first second-axis (e.g., Y-axis) directional stress sensor.

As described hereinbelow with reference to FIG. 12, the sensing resistor Rsense_ya can be arranged as $Y1R_{TRAN}$ and $Y1R_{LONG}$ in series, while the sensing resistor Rsense_yb can be arranged as $Y2R_{TRAN}$ and $Y2R_{LONG}$ in series. The reference resistor Rrefya can be included by the precision device 1220, while the reference resistor Rrefyb can be included by the precision device 1222. Each of the reference resistors Rrefya and Rrefyb can be an example of a precision component.

The Y-axis directional stress sensor 450 generates the differential signal Vsense_y at intermediate nodes of the first and second branches of the second Wheatstone bridge. In an example, the differential signal Vsense_y can be buffered and/or converted to a single-ended Vsense_y signal by the operational amplifier 452 in cooperation with the feedback resistor Rfby. The signal Vsense_y (whether single-ended or differential) is a Y-axis compensating analog signal (e.g., for compensating in response to sensing the Y-axis resultant of an encountered stress vector). The Y-axis compensating analog signal is coupled to the signal conditioner 420 for compensating an output of the analog circuit 410 (as described herein-following).

The signal conditioner 420 includes a first input coupled to an output (e.g., for generating a compensating analog signal that indicates the stress quantity generated by the X-axis directional stress sensor 440) of the analog frontend 402, a second input coupled to an output of an analog circuit 410 (which can output a signal that can include an operating parameter that is adversely affected by a change in substrate 401 stress vectors), an optional third input coupled to an output (e.g., for generating a compensating analog signal that indicates the stress quantity generated by the Y-axis directional stress sensor 450) of the analog frontend 402, and an output at which a compensated output signal is generated in response to the at least one compensating analog signal and an output analog signal of the analog circuit. Examples of the generation of the compensated output signal are discussed hereinbelow with reference to signal conditioner Various examples of the signal conditioner 420 can include a digital signal processor such as DSP 421. In examples of the signal conditioner 420 including a DSP 421, the signal conditioner can include an analog-to-digital converter such as ADC 422 for receiving and converting the X-axis compensating analog signal to an X-axis compensating digital signal, an ADC 423 for receiving and converting an analog signal from the analog circuit 410 to a output digital signal of the analog circuit, an ADC 424 for receiving and converting a Y-axis compensating analog signal to an Y-axis compensating digital signal, and a digital-to-analog converter (DAC) for converting a digital compensated output signal to an analog compensated output signal, an ADC 426 for receiving and converting an analog temperature signal from the temperature sensor 430 to a digital temperature signal. The DSP 421 is arranged to generate the digital compensated output signal in response to the X-axis compensating digital signal, optionally the digital temperature signal, the output digital circuit of the analog circuit 410, optionally the Y-axis compensating digital signal, and optionally the digital temperature signal. Other examples of the signal conditioner 420 need not include digital circuitry, so that the compensated circuits can be compensated solely by analog circuitry.

In at least one example, the DSP 421 can be arranged to provide measurements used to perform trimming, correction, and/or calibration of a precision component. In an example, the DSP (e.g., via ADC 422) can determine a voltage generated in response to a trimmable resistor, so that trimming parameters can be generated in response to the determined voltage and the trimmable resistor subsequently trimmed. In an example, the DSP (e.g., via ADC 422) can determine a voltage generated in response to a trimmed resistor, so that a selected voltage for at least one power rail can be determined and applied to the trimmed resistor in response to the determined voltage. In an example, the DSP (e.g., via ADC 422) can determine a voltage generated in response to a trimmed resistor, so that a selected voltage for at least one power rail can be determined and applied to the trimmed resistor in response to the determined voltage. In an example, the DSP (e.g., via ADC 422) can determine a voltage generated in response to a trimmed resistor, so that a selected voltage can be determined and applied to a circuit for stress and/or temperature compensation of the circuit. In various examples, the DSP 421 can be arranged to execute instructions from a memory (not shown) to determine higher order (e.g., n-th order coefficients to more finely compensate the analog output of analog circuit 410 for various stresses encountered in the substrate 401.

Figure 5:
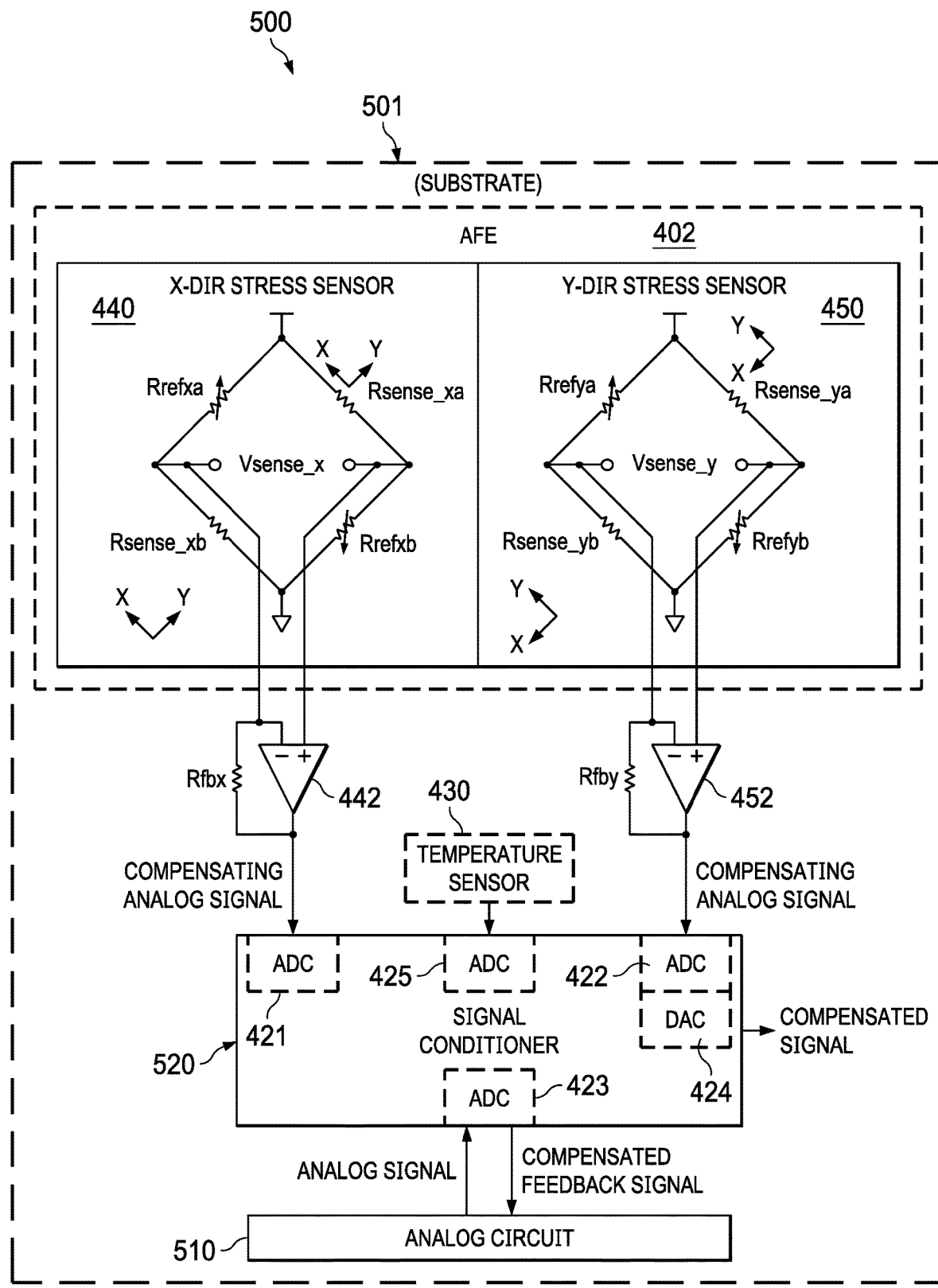
FIG. 5 is a schematic diagram of an example Wheatstone bridge-based analog frontend for feedback-based stress compensation of analog signals.

FIG. 5 is a schematic diagram of an example Wheatstone bridge-based analog frontend for feedback-based stress compensation of analog signals. The system 500 is an example system that includes a substrate 501, an analog circuit 510, a signal conditioner 520, a temperature sensor 430, a first-axis directional stress sensor (e.g., X-axis directional stress sensor 440), an optional second-axis directional stress sensor (e.g., Y-axis directional stress sensor 450), operational amplifier 442 and operational amplifier 452 (e.g., that are each configured as double-ended to single-ended converters). The system 500 operates in a manner similar to the system 400 although the analog circuit 510 is arranged to generate a compensated feedback signal in response to at least one compensating analog signal and the analog circuit is arranged to output the analog signal in response to the compensated feedback signal.

Various sensor circuits (such as the analog frontends 402, 602, 702, 802, and 950) can be coupled to various circuits (e.g., that are external to a given sensor circuit), where such external circuits can include passive components (e.g., resistors and capacitors) and/or active analog circuitry (such as DACs, transistors, and operational amplifiers) for driving (or otherwise operating) the sensor. Electrical parameters of one or more components of the external circuits can also be affected by imparted stress vectors, so that the signals that are being generated to drive the sensor circuits are also affected by an applied stress (so that the effects of stress are compounded by being applied directly to the stress sensor and by introducing higher order effects by affecting the signals applied to the stress sensor). This compounding of the effects of the stress vectors causes higher order effects that can decrease an accuracy of the sensor readout. Such higher order effects can be compensated (e.g., reduced) in response to the stress sensing signal being fed back (e.g., by being coupled as a negative feedback signal) to the sensor circuit, so that the fed-back stress sensing circuit can reduce the compounding of the such higher order effects (e.g., which increases the precision of the sensor readout). In an example, the compensated signal (e.g., a stress-corrected Vref signal) can be substantially identical to an input signal (e.g. a nominal Vref signal) that is received by at least one of the elements coupled to (e.g., included by) the sensor circuit.

Example AFEs for generating Vsense_x and Vsense_y signals for stress compensation are described hereinbelow with respect to FIG. 6 through FIG. 8.

Figure 6:
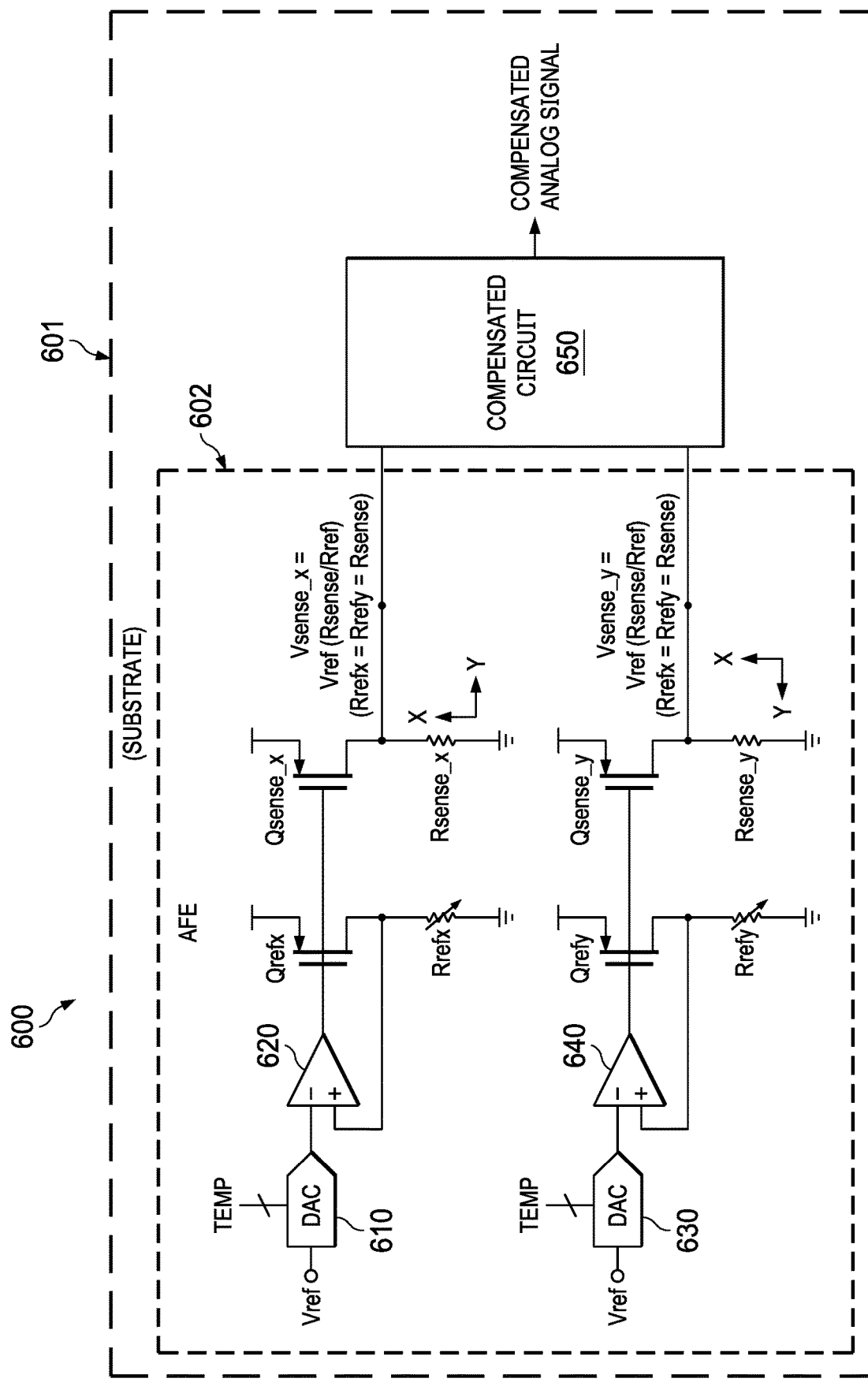
FIG. 6 is a schematic diagram of an example operational amplifier-controlled current source for stress compensation of analog signals.

FIG. 6 is a schematic diagram of an example operational amplifier-controlled current source for stress compensation of analog signals. The system 600 is an example system that includes a substrate 601, an analog frontend 602, and a compensated circuit 650.

The analog frontend 602 includes a DAC 610, an operational amplifier 620, a transistor Qrefx, a transistor Qsense_x, a (trimmable) resistor Rrefx and a resistor Rsense_x. The operational amplifier 620 is arranged to control—in response to the Rrefx resistor (e.g., a precision component)—a current for generating the Vsense_x analog compensating signal. The resistor Rrefx is a precision component such as a trimmable or trimmed resistor and has a first terminal coupled to the drain of the transistor Qrefx and a second terminal coupled to the second power rail. The resistor Rrefx develops a voltage at the Rrefx first terminal in response to the controlled current sourced by the transistor Qrefx. The base of the transistor Qrefx is coupled to the output of the operational amplifier 620. The operational amplifier controls the transistor Qrefx current in response to the voltage developed at the first terminal of the resistor Rrefx and the output voltage of the DAC 610. The output voltage of the DAC 610 is developed in response to a reference voltage (e.g., Vref) and a temperature indication (e.g., a digital temperature value). The temperature indication can be used to control the temperature sensitivity of the resistor Rsense_x as well as a temperature-related offset drift of the compensated circuit 650 (e.g., which can be an oscillator). The output of the operational amplifier 620 is also coupled to the transistor Qsense_x, so that the current sourced by transistor Qrefx is mirrored (e.g., proportionately mirrored) by the transistor Qsense_x. The drain of the transistor Qsense_x is coupled to the first terminal of the resistor Rsense_x. The resistor Rsense_x is a first-axis stress sensor that further includes a second terminal coupled to the second power rail. The resistor Rsense_x develops a voltage Vsense_x (e.g., a compensating analog signal) at the Rsense_x first terminal in response to the controlled current sourced by the transistor Qsense_x and in response to a longitudinal resultant of a stress vector exerted in the piezoelectric material of the substrate 601.

The analog frontend 602 further includes a DAC 630, an operational amplifier 640, a transistor Qrefy, a transistor Qsense_y, a (trimmable) resistor Rrefy and a resistor Rsense_y. The operational amplifier 640 is arranged to control—in response to the Rrefy resistor (e.g., a precision component)—a current for generating the Vsense_y analog compensating signal. The resistor Rrefy is a precision component such as a trimmable or trimmed resistor and has a first terminal coupled to the drain of the transistor Qrefy and a second terminal coupled to the second power rail. The resistor Rrefy develops a voltage at the Rrefy first terminal in response to the controlled current sourced by the transistor Qrefy. The base of the transistor Qrefy is coupled to the output of the operational amplifier 640. The operational amplifier 640 controls the transistor Qrefy current in response to the voltage developed at the first terminal of the resistor Rrefy and the output voltage of the DAC 630. The output voltage of the DAC 630 is developed in response to a reference voltage (e.g., Vref) and a temperature indication (e.g., a digital temperature value). The temperature indication can be used to control the temperature sensitivity of the resistor Rsense_y as well as a temperature-related offset drift of the compensated circuit 650 (e.g., which can be temperature-sensitive oscillator). The output of the operational amplifier 640 is also coupled to the transistor Qsense_y, so that the current sourced by transistor Qrefy is mirrored (e.g., proportionately mirrored) by the transistor Qsense_y. The drain of the transistor Qsense_y is coupled to the first terminal of the resistor Rsense_y. The resistor Rsense_y is a second-axis stress sensor that further includes a second terminal coupled to the second power rail. The resistor Rsense_y develops a voltage Vsense_y (e.g., a compensating analog signal) at the Rsense_y first terminal in response to the controlled current sourced by the transistor Qsense_y and in response to a transverse resultant of a stress vector exerted in the piezoelectric material of the substrate 601.

The compensated circuit 650 is coupled to receive the Vsense_x and the Vsense_y analog compensating signals from the analog frontend 602 and to generate a compensated analog signal in response to the Vsense_x and the Vsense_y analog compensating signals (and optionally in response to the temperature indication).

Figure 7:
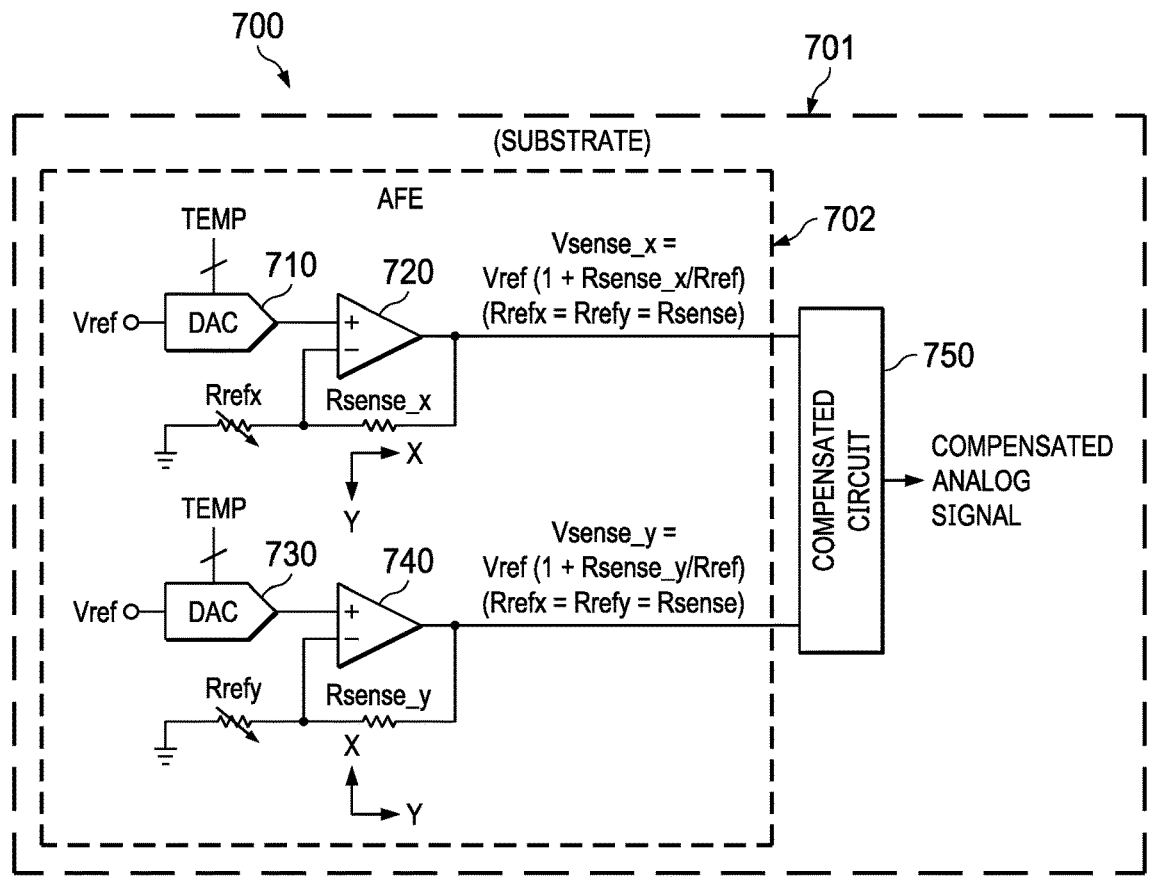
FIG. 7 is a schematic diagram of an example operational amplifier-controlled amplifier for stress compensation of analog signals.

FIG. 7 is a schematic diagram of an example operational amplifier-controlled amplifier for stress compensation of analog signals. The system 700 is an example system that includes a substrate 701, an analog frontend 702, and a compensated circuit 750.

The analog frontend 702 includes a DAC 710, an operational amplifier 720, a (trimmable) resistor Rrefx and a resistor Rsense_x. The operational amplifier 720 is arranged as a non-inverting amplifier to generate an amplified Vsense_x analog compensating signal in response to the ratio of value of the resistor Rsense_x over the value of the Rrefx resistor. In an example the voltage of Vsense_x is equal to Vref*(1+Rsense_x/Rrefx). The resistor Rrefx is a precision component such as a trimmable or trimmed resistor and has a first terminal coupled to the second power rail and a second terminal coupled to the inverting input of the operational amplifier 720. The resistor Rsense_x is coupled between the output of the operational amplifier 720 and the non-inverting input of the operational amplifier 720, so that the output of the operational amplifier 720 is controlled in response to a longitudinal resultant of a stress vector exerted in the piezoelectric material of the substrate 701. The non-inverting input of the operational amplifier 720 is coupled to the output of DAC 710 (which is coupled to receive a Vref signal and a temperature indication), so that the temperature indication can be used to control the temperature sensitivity of the resistor Rsense_x as well as a temperature-related offset drift of the compensated circuit 750 (e.g., which can be an oscillator).

The analog frontend 702 further includes a DAC 730, an operational amplifier 740, a (trimmable) resistor Rrefy and a resistor Rsense_y. The operational amplifier 740 is arranged as a non-inverting amplifier to generate an amplified Vsense_y analog compensating signal in response to the ratio of value of the resistor Rsense_y over the value of the Rrefy resistor. In an example the voltage of Vsense_y is equal to Vref*(1+Rsense_y/Rrefy). The resistor Rrefy is a precision component such as a trimmable or trimmed resistor and has a first terminal coupled to the second power rail and a second terminal coupled to the inverting input of the operational amplifier 740. The resistor Rsense_y is coupled between the output of the operational amplifier 740 and the non-inverting input of the operational amplifier 740, so that the output of the operational amplifier 740 is controlled in response to a transverse resultant of a stress vector exerted in the piezoelectric material of the substrate 701. The non-inverting input of the operational amplifier 740 is coupled to the output of DAC 730 (which is coupled to receive a Vref signal and a temperature indication), so that the temperature indication can be used to control the temperature sensitivity of the resistor Rsense_y as well as a temperature-related offset drift of the compensated circuit 750 (e.g., which can be an oscillator). In an example, the operation amplifier 740 is arranged to generate an amplified analog compensating signal in response to the ratio of a value of the first-axis stress sensor to a value of the precision component.

The compensated circuit 750 is coupled to receive the Vsense_x and the Vsense_y analog compensating signals from the analog frontend 702 and to generate a compensated analog signal in response to the Vsense_x and the Vsense_y analog compensating signals (and optionally in response to the temperature indication).

Figure 8:
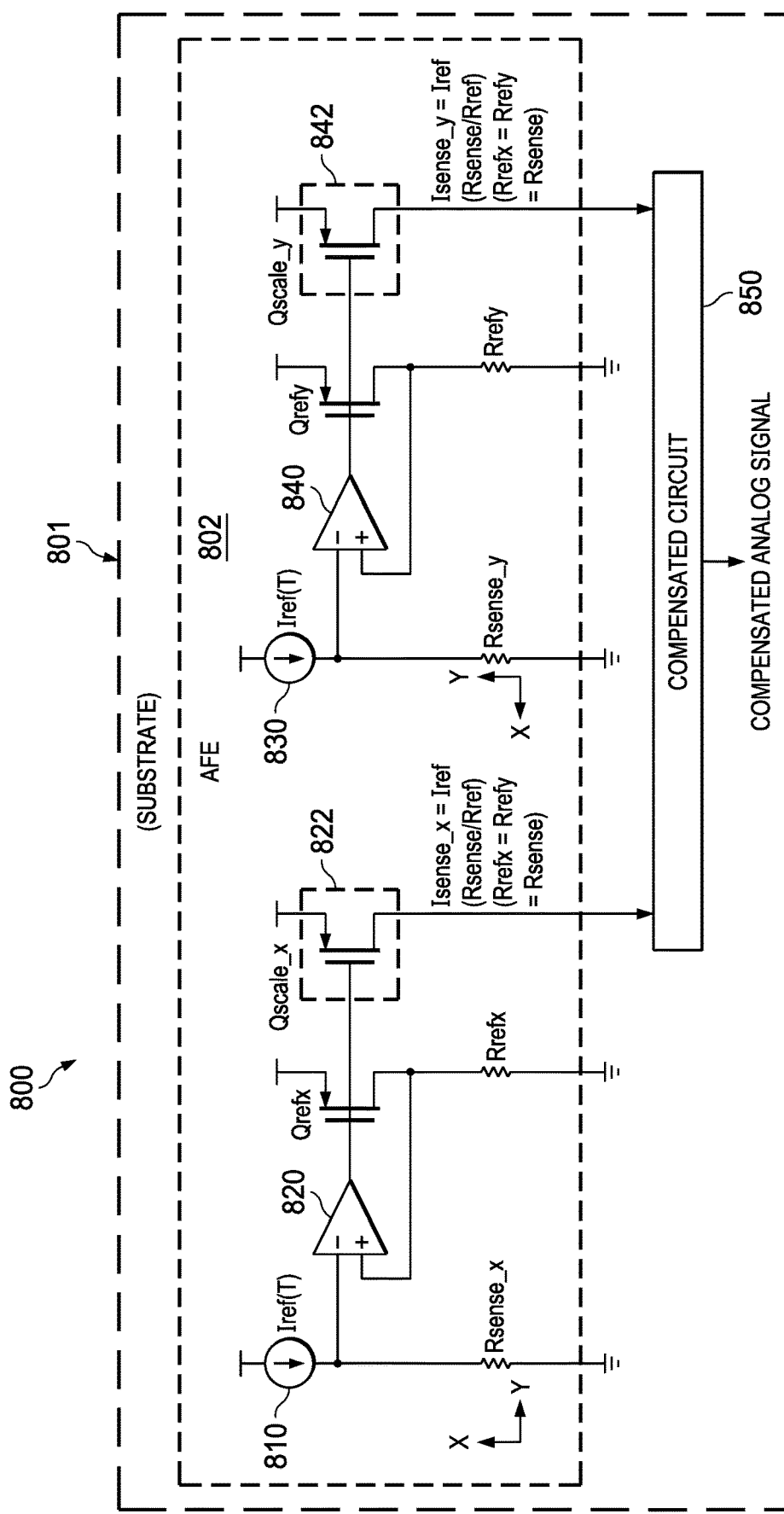
FIG. 8 is a schematic diagram of an example current-controlled current source for stress compensation of analog signals.

FIG. 8 is a schematic diagram of an example current-controlled current source for stress compensation of analog signals. The system 800 is an example system that includes a substrate 801, an analog frontend 802, and a compensated circuit 850.

The analog frontend 802 includes a current source 810, an operational amplifier 820, a resistor Rsense_x, and a (trimmable) resistor Rrefx. The analog frontend (e.g., 802) includes a current source 822 that is arranged to generate a source current, so that the analog compensating signal (e.g., Isense_x) is generated in response to the source current and in response to a difference (e.g., a change in resistance) between the resistor Rsense_x (e.g., x-axis directional stress sensor) and the resistor Rrefx (e.g., first precision component). The resistor Rsense_x includes a first terminal coupled to an output of the current source 810 and an inverting input of the operational amplifier 820 and includes a second terminal coupled to a second power rail. In an example, the current source 810 is a temperature-dependent current, so that temperature-dependent effects of the resistor Rsense_x are reduced. The output of the operational amplifier 820 is coupled to the gate of the transistor Qrefx, so that the operational amplifier controls the source-to-drain current of the transistor Qrefx. The drain (which is a non-control terminal) of the transistor Qrefx is coupled to the non-inverting input of the operational amplifier 820 and to a first terminal of the resistor Rrefx, which includes a second terminal coupled to the second power rail. The voltage of the non-inverting input of the operational amplifier 820 is developed in response to the source-to-drain current of the transistor Qrefx and to the resistance of the resistor Rrefx, so that the output of the operational amplifier 820 is controlled in response to a difference between the resistor Rsense_x (e.g., x-axis directional stress sensor) and the resistor Rrefx (e.g., first precision component) and so that the output of the operational amplifier 820 is controlled in response to a longitudinal resultant of a stress vector exerted in the piezoelectric material of the substrate 801. The output of the operational amplifier 820 is also coupled to the transistor Qscale_x, so that the current sourced by current source 822 is mirrored (e.g., proportionately mirrored) by the transistor Qscale_x. In an example, the output of the current source 822 the analog compensating signal (e.g., Isense_x), which is coupled to a first input of the compensated circuit 850.

The analog frontend 802 also includes a current source 830, an operational amplifier 840, a resistor Rsense_y, and a (trimmable) resistor Rrefy. The analog frontend (e.g., 802) includes a current source 842 that is arranged to control a current for generating the analog compensating signal (e.g., Isense_y) in response to a difference (e.g., a change in resistance) between the resistor Rsense_y (e.g., y-axis directional stress sensor) and the resistor Rrefy (e.g., first precision component). The resistor Rsense_y includes a first terminal coupled to an output of the current source 830 and an inverting input of the operational amplifier 840 and includes a second terminal coupled to a second power rail. In an example, the current source 830 is a temperature-dependent current, so that temperature-dependent effects of the resistor Rsense_x are reduced. The output of the operational amplifier 840 is coupled to the gate of the transistor Qrefy, so that the operational amplifier controls the source-to-drain current of the transistor Qrefy. The drain (which is a non-control terminal) of the transistor Qrefy is coupled to the non-inverting input of the operational amplifier 840 and to a first terminal of the resistor Rrefy, which includes a second terminal coupled to the second power rail. The voltage of the non-inverting input of the operational amplifier 840 is developed in response to the source-to-drain current of the transistor Qrefy and to the resistance of the resistor Rrefy, so that the output of the operational amplifier 840 is controlled in response to a difference between the resistor Rsense_y (e.g., y-axis directional stress sensor) and the resistor Rrefy (e.g., first precision component) and so that the output of the operational amplifier 840 is controlled in response to a transverse resultant of a stress vector exerted in the piezoelectric material of the substrate 801. The output of the operational amplifier 840 is also coupled to the transistor Qscale_y, so that the current sourced by current source 842 is mirrored (e.g., proportionately mirrored) by the transistor Qscale_y. In an example, the output of the current source 842 the analog compensating signal (e.g., Isense_y), which is coupled to a second input of the compensated circuit 850.

The compensated circuit 850 is coupled to receive the Isense_x and the Isense_y analog compensating signals from the analog frontend 802 and to generate a compensated analog signal in response to the Isense_x and the Isense_y analog compensating signals (and optionally in response to the temperature indication). As described hereinbelow with reference to FIG. 9, the stress dependent currents can be combined to generate a combined analog compensation signal (e.g., current) that indicates a scalar of the combined longitudinal and transverse stresses sensed in the substrate 801.

Examples of circuits that can be compensated for substrate stress include operational amplifiers (e.g., including operational amplifiers included in stress compensation circuits such as operational amplifiers 442, 452, 620, 640, 720, 740, 820, and 840), RC-oscillators, current and voltage reference generators (e.g., bandgap voltage reference voltage generators), ADCs (e.g., including ADCs 422, 423, and 424, DACs (e.g., DACs 425, 610, 630, 710, and 730), AFEs (e.g., including analog frontends 402, 602, 702, and 802), sensors (e.g., temperature sensors and humidity sensors). Power and layout requirements for compensating circuits can be reduced by sharing, for example, directional stress sensor signals/quantities for to-be-compensated circuits as well as the circuitry (e.g., operational amplifiers) arranged to compensate the to-be-compensated circuits and/or signals generated by the to-be-compensated circuits.

Figure 9:
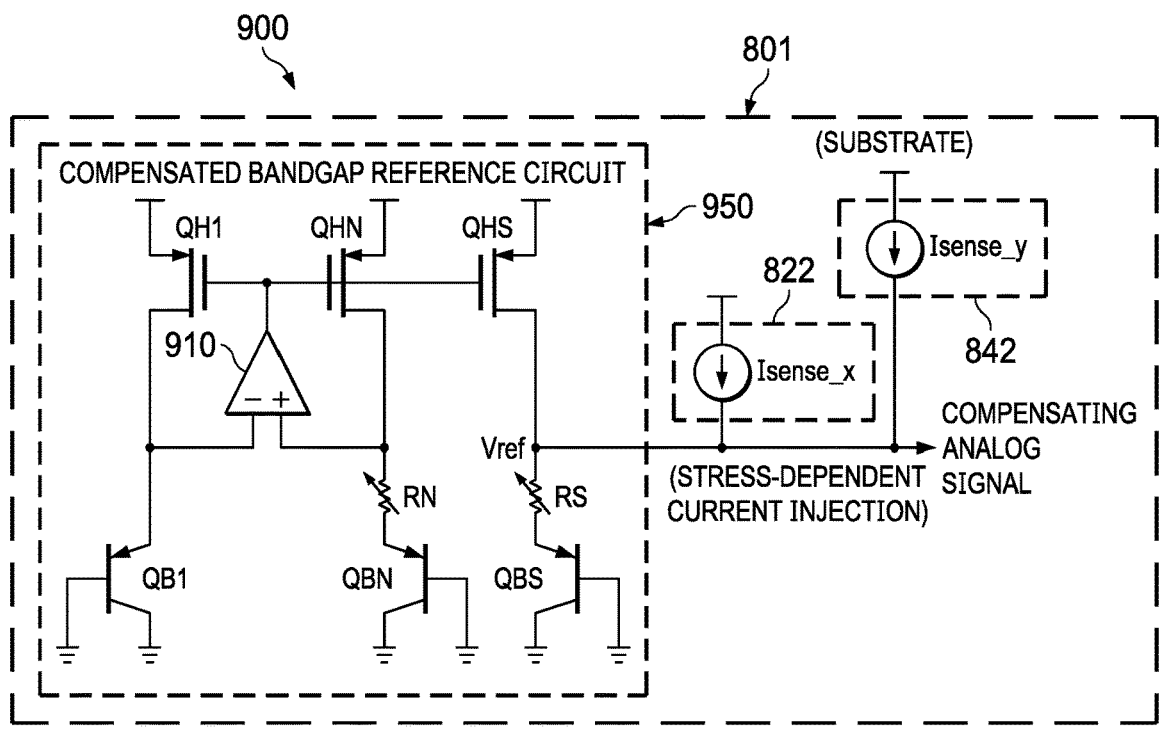
FIG. 9 is a schematic diagram of an example stress-compensated bandgap reference circuit coupled to at least one of the example current-controlled current sources of FIG. 8.

FIG. 9 is a schematic diagram of an example stress-compensated bandgap reference circuit coupled to at least one of the example current-controlled current sources of FIG. 8. The system 900 is an example system that includes the substrate 801, the current source 822, the current source 842, and a bandgap reference circuit 950 (e.g., a compensated bandgap voltage reference circuit).

The compensated bandgap reference circuit 950 is an example of the compensated circuit 850. The output signal of the bandgap reference circuit 950 (as well as the operation of a portion of the bandgap reference circuit 950 itself) can be compensated by the injection of the Isense_x and the Isense_y analog compensating signals into the output node (e.g., output terminal) of the bandgap reference circuit. As described hereinbelow, the output terminal can be included by a compensating circuit arranged to generate a combined analog compensation signal in response to the first-axis sensing signal and the second-axis sensing signal.

The bandgap reference circuit 950 includes a pair of matched transistors QH1 and QHN, where the respective gates of transistors QH1 and QHN are both commonly driven and controlled by the output signal of the operational amplifier. The respective sources of the transistors QH1 and QHN are coupled to a first power rail, so that a first current is sourced from the drain of the transistor QH1 and a second current is sourced from the drain of the transistor QHN, where the first and second currents are substantially equal. The first current is conducted through the emitter of the transistor QB1 and the second current is conducted through the emitter of the transistor QBN, where the emitter area of the transistor QBN is "n" times (e.g., 8 or 10) of the emitter area of the transistor QB1. The difference in emitter areas causes different current densities in the respective PN junctions (e.g., emitter-base junction) of the transistors QB1 and QBN. The different current densities generate mutually different voltages at the respective inputs of the operational amplifier 910. The generated voltages have negative temperature coefficients, while the difference between the generated voltages has a positive temperature coefficient. The output of the operational amplifier 910 drives the gates of the transistors QH1 and QHN (e.g., so that the inputs of the operational amplifier 910 are at an equal voltage) at a voltage of around 1.25 volts, that is independent of changes in temperature, power supply fluctuations, and process variations.

The output of the operational amplifier 910 is also coupled to the gate of the transistor QHS (e.g., a scaling transistor), so that a scaled current is generated in response to the output voltage of the operational amplifier 910. The drain of the transistor QHS is coupled to the emitter of the transistor QBS (e.g., scaled transistor), so that the scaled current is conducted through the emitter of the transistor QBS. The scaling of the scaled transistors QHS and QBS (as well as the trimmable/trimmed resistors RN and RS) can be selected such that voltage Vref (e.g., drain voltage of QHS) is correctly balanced in response to longitudinal and transverse substrate stresses by the stress-dependent current injection of the Isense_x current from current source 822 and the Isense_y current from the current source 842. In an example, the Isense_x current and the Isense_y current are injected into the Vref node in response to longitudinal and transverse substrate stresses, so that the stress-induced fluctuations (e.g., induced by coupled components other than the directional stress sensors) are reduced. In an example, the Vref node is an output reference node, where the Isense_x is a first-axis sensing signal and the Isense_y is a second-axis sensing signal, and (where the first-axis sensing signal and the second-axis sensing signal are injected into the output reference node of the analog circuit.

In various examples, the directional stress sensors coupled to precision components are arranged to compensate the stress by separation of the stress components aligned longitudinally or transverse to a substrate crystal axis without necessitating complex signal conditioning (e.g., signal conditioning performed solely by an analog AFE, by lower-order and/or higher-order digital processing by a compensation circuit, or by combinations thereof). As described hereinabove, different AFE topologies can be used depending on an end-use application (e.g., which might require temperature compensation, build-in amplification, or both). The directional stress signals (e.g., a first-axis sensing signal and a second axis sensing signal) that are applied for stress compensation can be stress-dependent voltage signals or stress-dependent current signals. As described herein, substrate stresses can be compensated for by stress compensation circuitry in an analog domain, a digital domain, or combinations thereof. The analog/digital boundary between the domains can be selected for a particular system application, chip topology, process technology, and circuit design constraints.

Directional stress compensation as described herein can include circuits for analog-based compensation, digital-based compensation, or mixed signal compensation. Analog circuits such as directional stress sensors are arranged to generate currents and/or voltages proportional to stress vectors (e.g., longitudinal, transverse, or a combination of the longitudinal and transverse stress vectors) to indicate stress-sensitive quantities used to compensate parameter of interest for a circuit to be stress compensated. A digital control interface (e.g., from an end user or by applications executing in the DSP of a compensation circuit) can include a calibration mode to precisely (e.g., under active digital control) select parametric tuning of sensors and sensor system components, resistor trim information for selecting an amplifier gain, component biasing, offset blocks (e.g., which can be an analog or analog/digital circuits that can compensate offset voltages or offset currents of circuit components such as operational amplifiers), and coefficients for digital correction and compensation (e.g. based on a regression of temperature effects, stress effects, and/or both temperature and stress effects).

Figure 10:
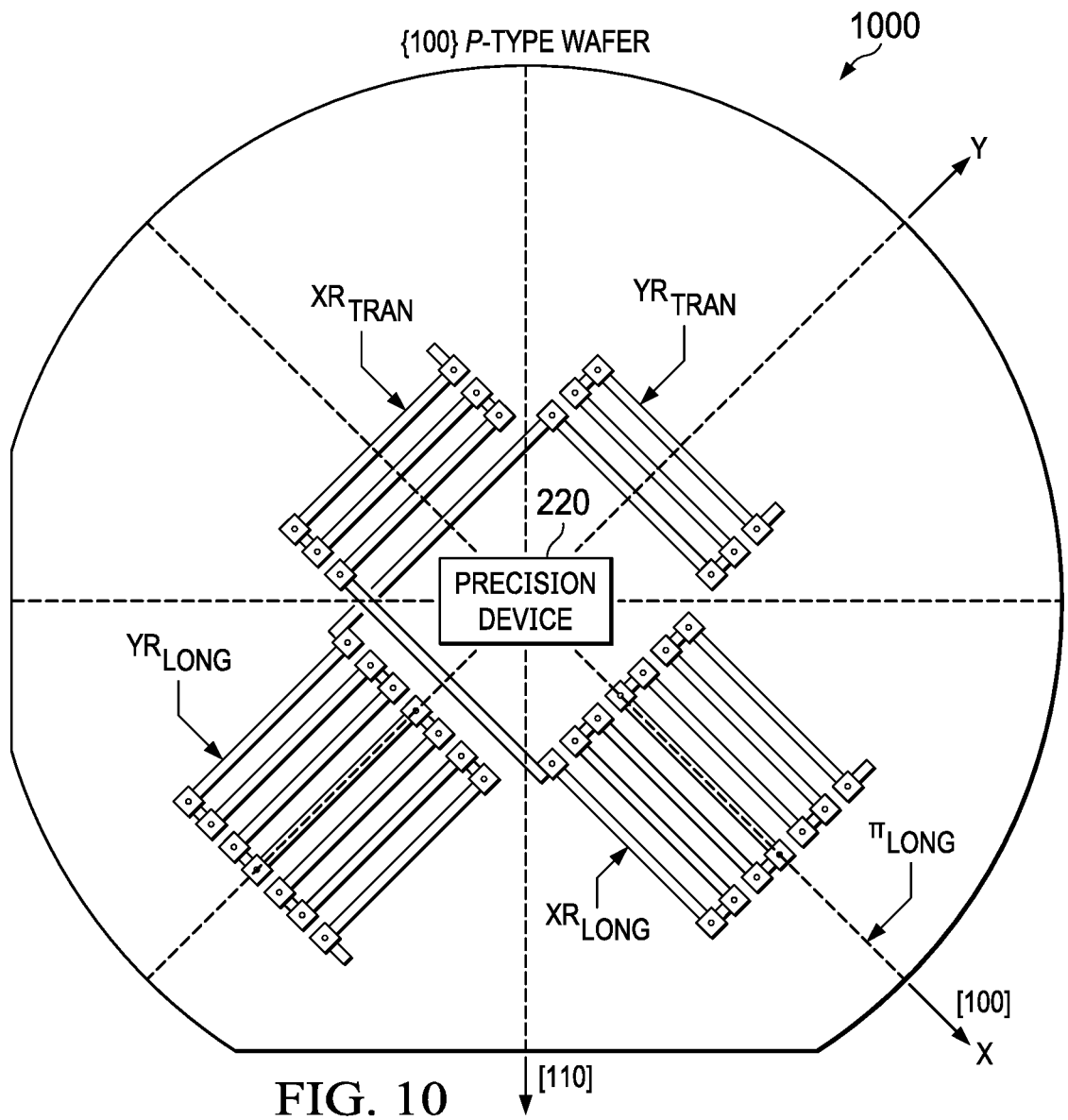
FIG. 10 is a top view of a wafer 1000, which is an example wafer that includes a precision device arranged between mutually orthogonally sensing directional stress sensors.

FIG. 10 is a top view of a wafer 1000, which is an example wafer that includes a precision device arranged between mutually orthogonally sensing directional stress sensors.

A first-axis stress sensor (e.g., for sensing a longitudinal resultant of a stress vector) includes the resistor pair $XR_{TRAN}$ and $XR_{LONG}$, which are coupled in series. The resistor pair $XR_{TRAN}$ and $XR_{LONG}$ of FIG. 10 can be similar to the resistor pair $XR_{TRAN}$ and $XR_{LONG}$ of FIG. 2. The resistor pair $XR_{TRAN}$ and $XR_{LONG}$ of FIG. 10 are arranged adjacent to the precision device 220, so that (for example) a portion of the precision device 220 lies between a portion of $XR_{TRAN}$ and a portion of $XR_{LONG}$. Arranging the resistor pair $XR_{TRAN}$ and $XR_{LONG}$ around (e.g., so that a portion of the precision device 220 lies between a portion of $XR_{TRAN}$ and a portion of $XR_{LONG}$) the precision device 220 can improve the sensing of a stress vector resultant (e.g., a longitudinal stress vector) acting upon the precision device 220 because the sensor is aligned along the axis of the applied stress and measures the applied stress on both sides (e.g., near and far sides) of the precision device (e.g., which improves the accuracy of the first-axis stress sensor as compared against a directional stress sensor located farther away from the precision device 220 and/or on one side of the precision device 220).

A second-axis stress sensor (e.g., for sensing a transverse or second-axis resultant of a stress vector) includes the resistor pair $YR_{TRAN}$ and $YR_{LONG}$, which are coupled in series. Although oriented with respect to the Y-axis the resistor pair $YR_{TRAN}$ and $YR_{LONG}$ of FIG. 10 can be similar to the resistor pair $XR_{TRAN}$ and $XR_{LONG}$ of FIG. 2. The resistor pair $YR_{TRAN}$ and $YR_{LONG}$ of FIG. 10 are arranged adjacent to the precision device 220, so that (for example) a portion of the precision device 220 lies between a portion of $YR_{TRAN}$ and a portion of $YR_{LONG}$. Arranging the resistor pair $YR_{TRAN}$ and $YR_{LONG}$ around (e.g., so that a portion of the precision device 220 lies between a portion of $YR_{TRAN}$ and a portion of $YR_{LONG}$) the precision device 220 can improve the sensing of a stress vector resultant (e.g., a transverse stress vector) acting upon the precision device 220 because the sensor is aligned along the axis of the applied stress and measures the applied stress on both sides (e.g., near and far sides) of the precision device (e.g., which improves the accuracy of the second-axis stress sensor as compared against a directional stress sensor located farther away from the precision device 220 and/or on one side of the precision device 220).

Figure 11:
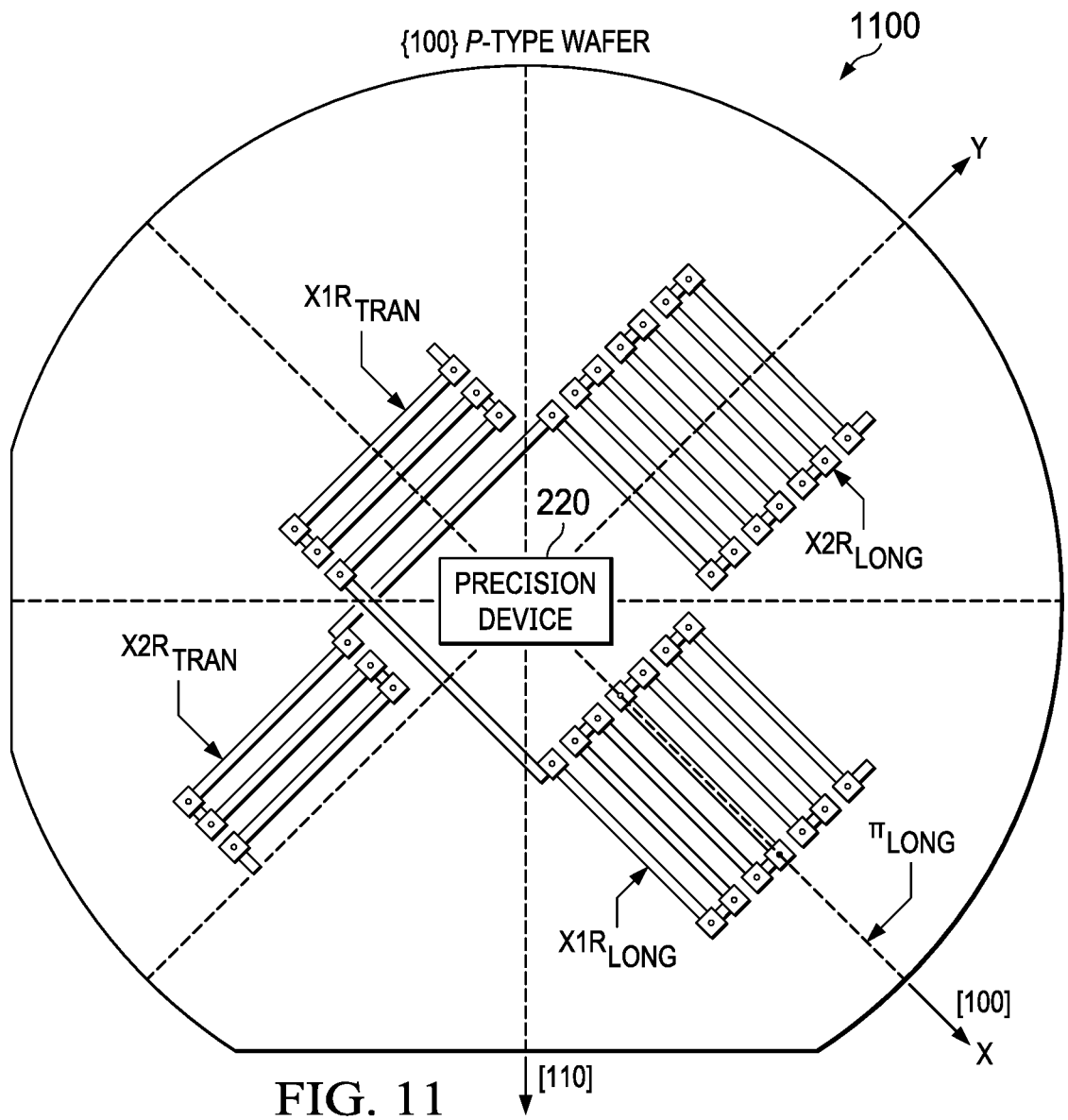
FIG. 11 is a top view of a wafer 1100, which is an example wafer that includes a precision device arranged between mutually longitudinally sensing directional stress sensors.

FIG. 11 is a top view of a wafer 1100, which is an example wafer that includes a precision device arranged between mutually longitudinally sensing directional stress sensors.

A first-axis stress sensor (e.g., for sensing a first longitudinal resultant of a stress vector) includes the resistor pair $X1R_{TRAN}$ and $X2R_{LONG}$, which are coupled in series. The resistor pair $X1R_{TRAN}$ and $X1R_{LONG}$ of FIG. 11 can be similar to the resistor pair $XR_{TRAN}$ and $XR_{LONG}$ of FIG. 2. The resistor pair $X1R_{TRAN}$ and $X1R_{LONG}$ of FIG. 11 are arranged adjacent to the precision device 220, so that (for example) a portion of the precision device 220 lies between a portion of $X1R_{TRAN}$ and a portion of $X1R_{LONG}$. Arranging the resistor pair $X1R_{TRAN}$ and $X1R_{LONG}$ around (e.g., so that a portion of the precision device 220 lies between a portion of $X1R_{TRAN}$ and a portion of $X1R_{LONG}$) the precision device 220 can improve the sensing of a stress vector resultant (e.g., a longitudinal stress vector) acting upon the precision device 220 because the sensor is aligned along the axis of the applied stress and measures the applied stress on both sides (e.g., near and far sides) of the precision device (e.g., which improves the accuracy of the first-axis stress sensor as compared against a directional stress sensor located farther away from the precision device 220 and/or on one side of the precision device 220).

A second first-axis stress sensor (e.g., for sensing a second longitudinal or first-axis resultant of a stress vector) includes the resistor pair $X2R_{TRAN}$ and $X2R_{LONG}$, which are coupled in series. The resistor pair $X2R_{TRAN}$ and $X2R_{LONG}$ of FIG. 11 can be similar to the resistor pair $YR_{TRAN}$ and $YR_{LONG}$ of FIG. 2, although the longitudinal and transverse conductors are arranged with an inverted ratio of resistances, so that the longitudinal resultant is sensed in the additional sensing area. The resistor pair $X2R_{TRAN}$ and $X2R_{LONG}$ of FIG. 11 are arranged adjacent to the precision device 220, so that (for example) a portion of the precision device 220 lies between a portion of $X2R_{TRAN}$ and a portion of $X2R_{LONG}$. Arranging the resistor pair $X2R_{TRAN}$ and $X2R_{LONG}$ around (e.g., so that a portion of the precision device 220 lies between a portion of $X2R_{TRAN}$ and a portion of $X2R_{LONG}$) the precision device 220 can improve the sensing of a stress vector resultant (e.g., a longitudinal stress vector) acting upon the precision device 220 because the sensor is aligned along the axis of the applied stress and measures the applied stress on four sides of the precision device (e.g., combining the output signals of the first-axis and second-axis stress sensors improves the sensing accuracy over a single directional stress sensor or a single directional stress sensor located farther away from the precision device 220 and/or on one side of the precision device 220).

Figure 12:
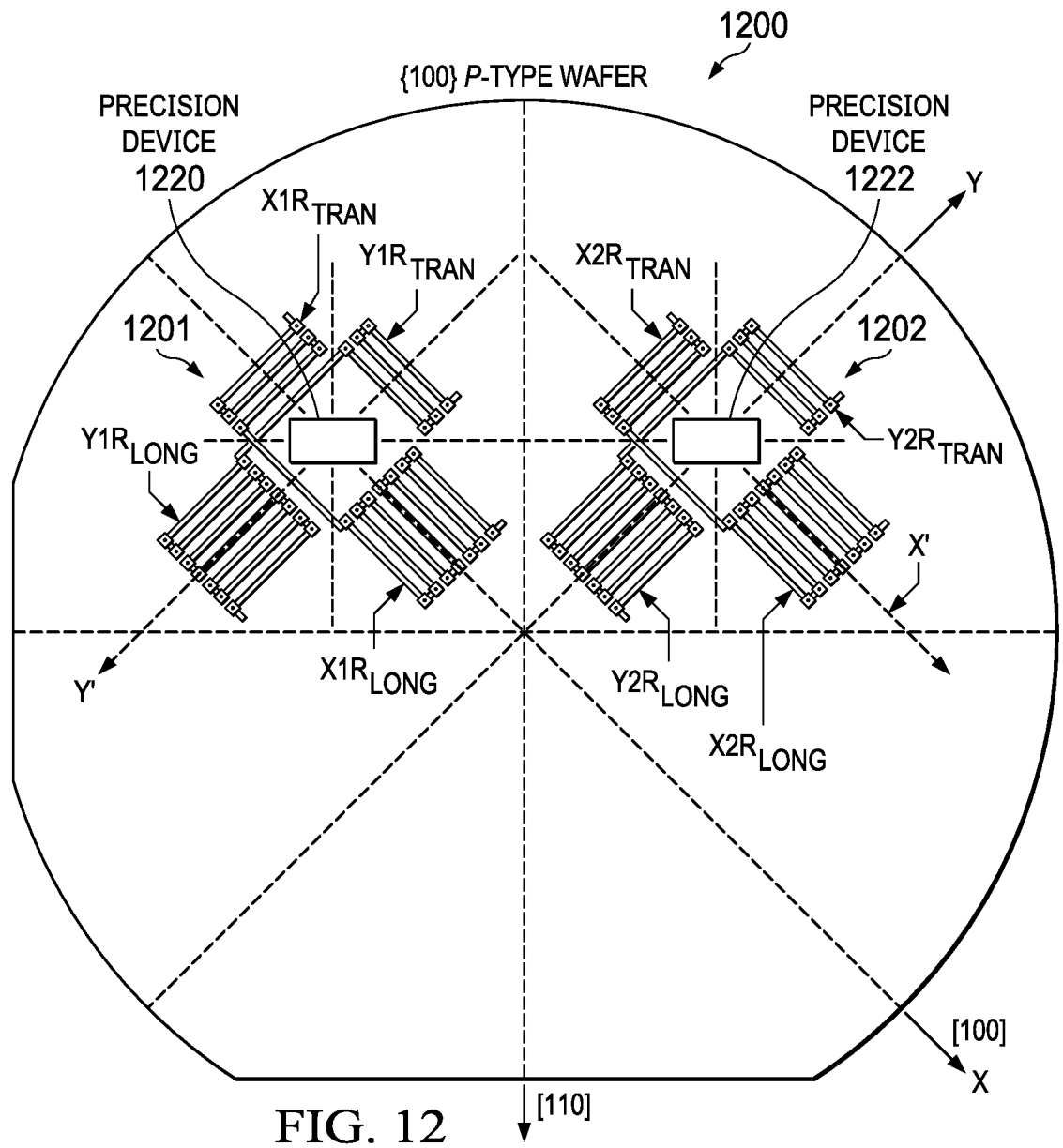
FIG. 12 is a top view of a wafer 1200, which is an example wafer that includes an example structure of reference resistors and stress-sensing resistors of a Wheatstone bridge.

FIG. 12 is a top view of a wafer 1200, which is an example wafer that includes an example structure of reference resistors and stress-sensitive resistors of a Wheatstone bridge. Quadrant 1201 includes a first x-axis stress sensor that includes the resistor pair $X1R_{TRAN}$ and $X1R_{LONG}$, which are coupled in series. The first x-axis stress sensor is arranged to sense a first longitudinal (e.g., a first first-axis) resultant of a stress vector localized with respect to the precision device 1220. Quadrant 1201 also includes a second x-axis stress sensor that includes the resistor pair $X2R_{TRAN}$ and $X2R_{LONG}$, which are coupled in series. The second x-axis stress sensor is arranged to sense a second longitudinal resultant (e.g., a second first-axis resultant) of a stress vector localized with respect to the precision device 1220. The structure of quadrant 1201 of FIG. 12 can be similar to the structure of FIG. 11.

Quadrant 1202 includes a first y-axis stress sensor that includes the resistor pair $Y1R_{TRAN}$ and $Y1R_{LONG}$, which are coupled in series. The first y-axis stress sensor is arranged to sense a first transverse resultant (e.g., a first second-axis resultant) of a stress vector localized with respect to the precision device 1222. Quadrant 1202 also includes a second y-axis stress sensor that includes the resistor pair $Y2R_{TRAN}$ and $Y2R_{LONG}$, which are coupled in series. The second y-axis stress sensor is arranged to sense a second transverse resultant (e.g., a second second-axis resultant) of a stress vector localized with respect to the precision device 1222. The structure of quadrant 1202 of FIG. 12 can be similar to the structure of FIG. 10, although the structure of quadrant 1202 is arranged to sense longitudinal stress vectors.

The precision device 1220 can include a first pair of trimmable resistors (such as the resistors Rrefxa and Rrefxb of X-axis directional stress sensor 440) and the first-axis and second-axis stress sensors can be, respectively, the resistors Rsense_xa and resistors Rsense_xb of X-axis directional stress sensor 440, so that the components of the structure of quadrant 1201 can be coupled as the Wheatstone bridge of the X-axis directional stress sensor 440. The accuracy of the X-axis directional stress sensor 440 (e.g., when arranged as shown by the structure of quadrant 1201) is increased because both of the reference resistors for generating each end of the differential signal differential signal Vsense_x have an increased accuracy for at least the reasons described herein above with respect to FIG. 11.

The precision device 1222 can include a second pair of trimmable resistors (such as the resistors Rrefya and Rrefyb of a second-axis stress sensor such as Y-axis directional stress sensor 450) and the third and fourth directional stress sensors can be, respectively, the resistors Rsense_ya and resistors Rsense_yb of a second-axis stress sensor (e.g., Y-axis directional stress sensor 450), so that the components of the structure of quadrant 1202 can be coupled as the example Wheatstone bridge of the Y-axis directional stress sensor 450. The accuracy of the example Wheatstone bridge of the Y-axis directional stress sensor 450 when arranged in accordance with the structure of quadrant 1202 is increased because both of the reference resistors for generating each end of the differential signal differential signal Vsense_y have an increased accuracy for at least the reasons described herein above with respect to FIG. 11.

Figure 13:
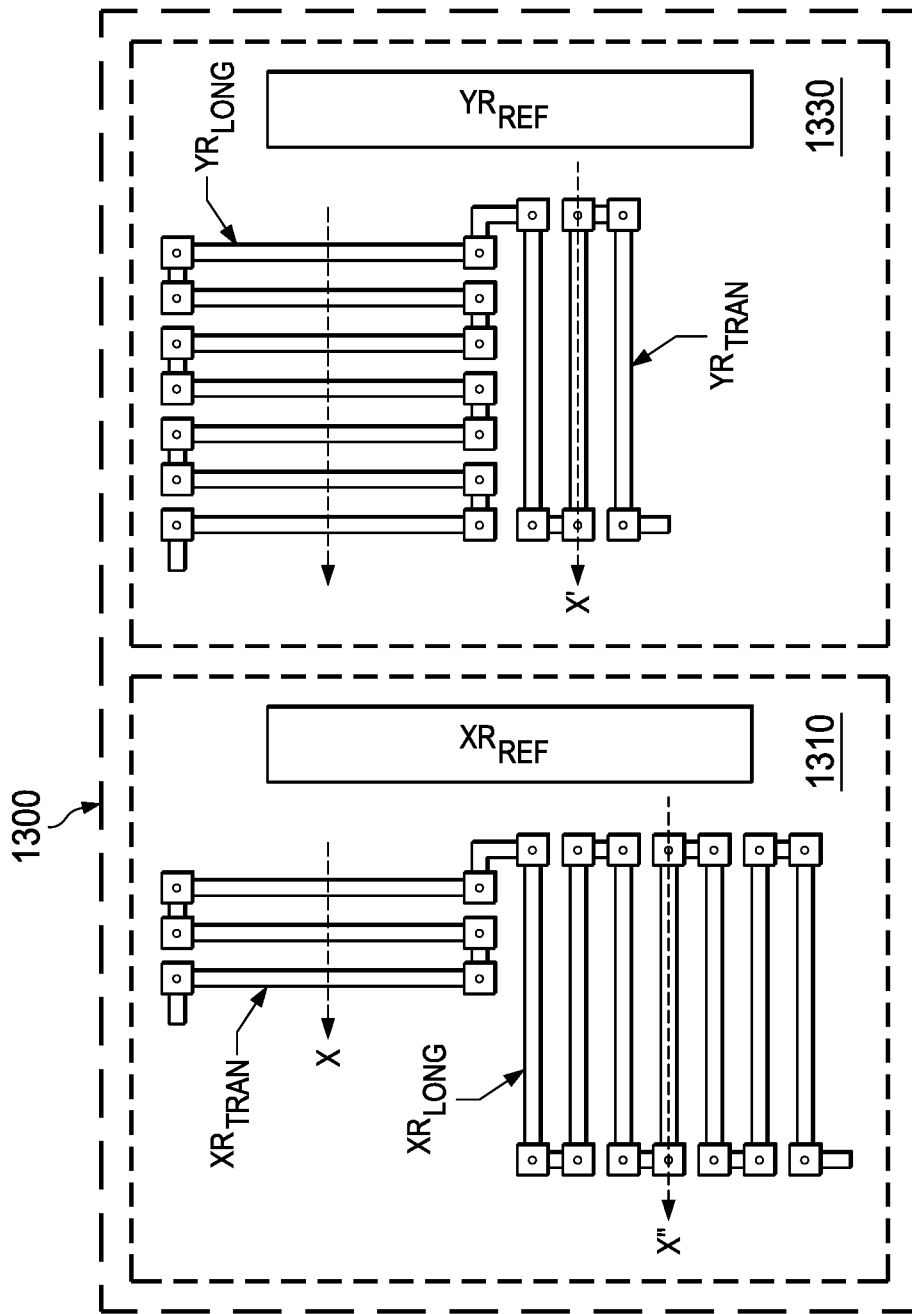
FIG. 13 shows an example region of a semiconductor substrate that includes example precision components, an example first-axis stress sensor, and an example second-axis stress sensor.

FIG. 13 shows an example region of a semiconductor substrate that includes example precision components, an example first-axis stress sensor, and an example second-axis stress sensor. The region 1300 is an example region the includes area 1310 and area 1330 that collectively show an example layout of the example precision components, the example first-axis stress sensor, and the example second-axis stress sensor.

The area 1310 includes a first-axis stress sensor and the precision component $XR_{REF}$. The first-axis stress sensor includes the resistor pair $XR_{TRAN}$ and $XR_{LONG}$, which are coupled in series. The first-axis stress sensor is arranged to sense a longitudinal resultant (e.g., a first-axis resultant) of a stress vector localized with respect to the precision component $XR_{REF}$.

The area 1330 includes a second-axis stress sensor and the precision component $YR_{REF}$. The second-axis stress sensor includes the resistor pair $YR_{TRAN}$ and $YR_{LONG}$, which are coupled in series. The second-axis stress sensor is arranged to sense a transverse resultant (e.g., a second-axis resultant) of a stress vector localized with respect to the precision component $YR_{REF}$.

Precision component $XR_{REF}$ is formed between a portion of the first-axis stress sensor formed in area 1310 of the region 1300 and a portion of the second-axis stress sensor formed in area 1330 of the region 1300. Forming the precision component $XR_{REF}$ therebetween more accurately determines the instantaneous magnitudes of the stress vectors affecting a performance parameter of the precision component $XR_{REF}$ (as compared against a less accurately determined instantaneous magnitude of stress vectors applied to precision component not being formed therebetween).

Figure 14:
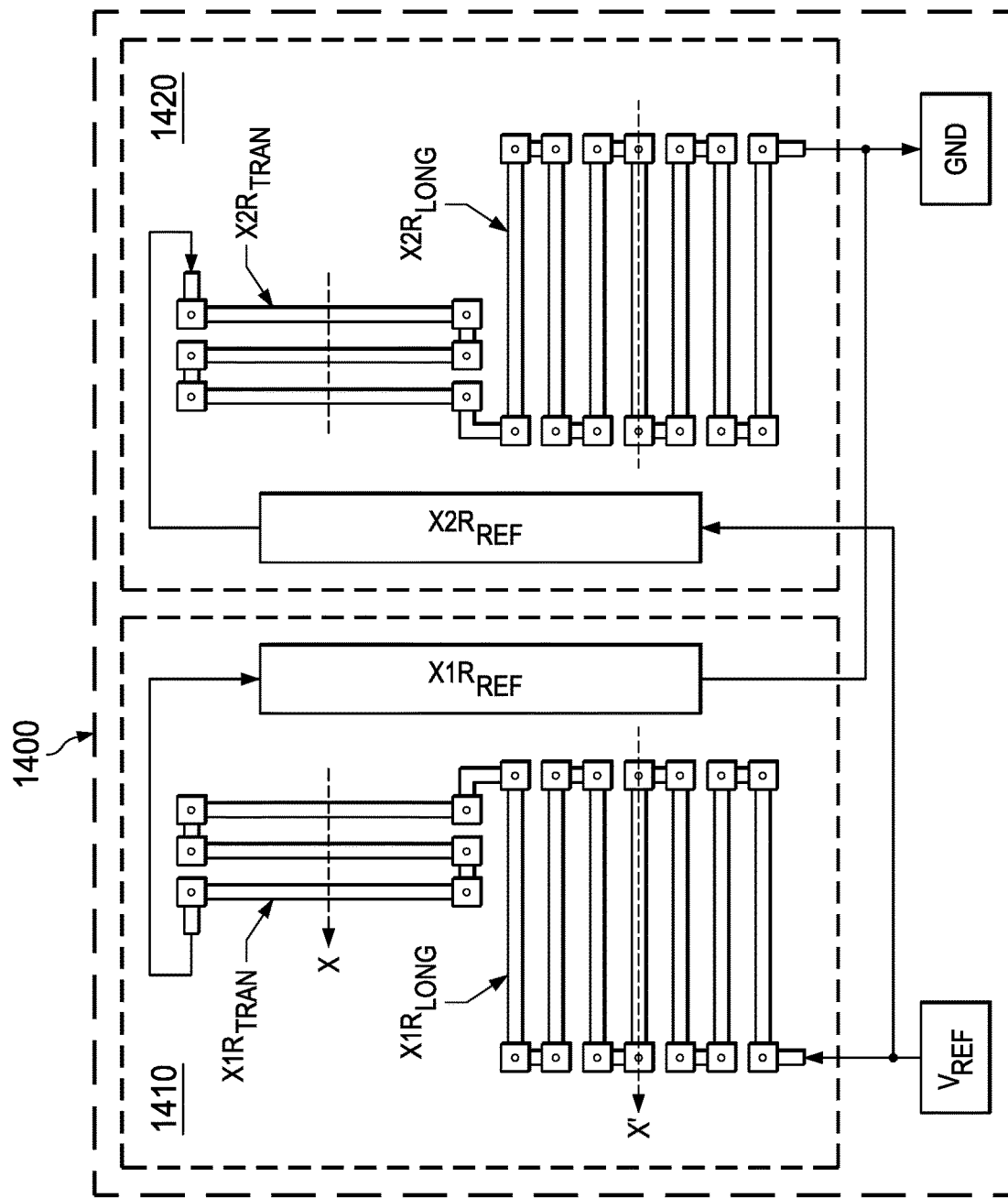
FIG. 14 is a layout diagram showing an example Wheatstone bridge structure that includes two example X-axis sensors, each having a respective example precision component.

FIG. 14 is a layout diagram showing an example Wheatstone bridge layout that includes two example X-axis sensors, each having a respective example precision component. The example Wheatstone bridge can be an example layout of the X-axis directional stress sensor 440 described hereinabove.

The example Wheatstone bridge is formed on a region 1400 of a semiconductor substrate. The region 1400 is an example region that includes area 1410 and area 1430 that collectively show an example layout of the X-axis directional stress sensor 440.

The area 1410 includes a first first-axis stress sensor and the precision component $X1R_{REF}$. The first first-axis stress sensor includes the resistor pair $X1R_{TRAN}$ and $X1R_{LONG}$, which are coupled in series. The first first-axis stress sensor is arranged to sense a longitudinal resultant (e.g., a first-axis resultant) of a stress vector localized with respect to the precision component $X1R_{REF}$.

The area 1420 includes a second first-axis stress sensor and the precision component $X2R_{REF}$. The second first-axis stress sensor includes the resistor pair $X2R_{TRAN}$ and $X2R_{LONG}$, which are coupled in series. The second first-axis stress sensor is arranged to sense a longitudinal resultant (e.g., a first-axis resultant) of a stress vector localized with respect to the precision component $X2R_{REF}$.

Precision components $X1R_{REF}$ and $X2R_{REF}$ are formed between a portion of the first-axis stress sensor formed in area 1410 of the region 1400 and a portion of the second-axis stress sensor formed in area 1420 of the region 1400. Forming the precision component $X1R_{REF}$ and $X2R_{REF}$ therebetween more accurately determines the instantaneous magnitudes of the stress vectors affecting a performance parameter of the precision components $X1R_{REF}$ and $X2R_{REF}$ (as compared against a less accurately determined instantaneous magnitude of stress vectors applied to precision component not being formed therebetween). The accuracy of the Wheatstone bridge laid out on region 1400 includes better matching of the components that result from process imperfections, reduced noise, increase in the output voltage (e.g., by a factor of two as compared against a single branch of the Wheatstone bridge) as developed between the respective intermediate node of each of the two branches of the Wheatstone bridge, and more balanced effects of localized stress applied to each branch of the Wheatstone bridge, so that effects of stress are differentially reduced (if not entirely cancelled out) by the differential output signal.

Figure 15:
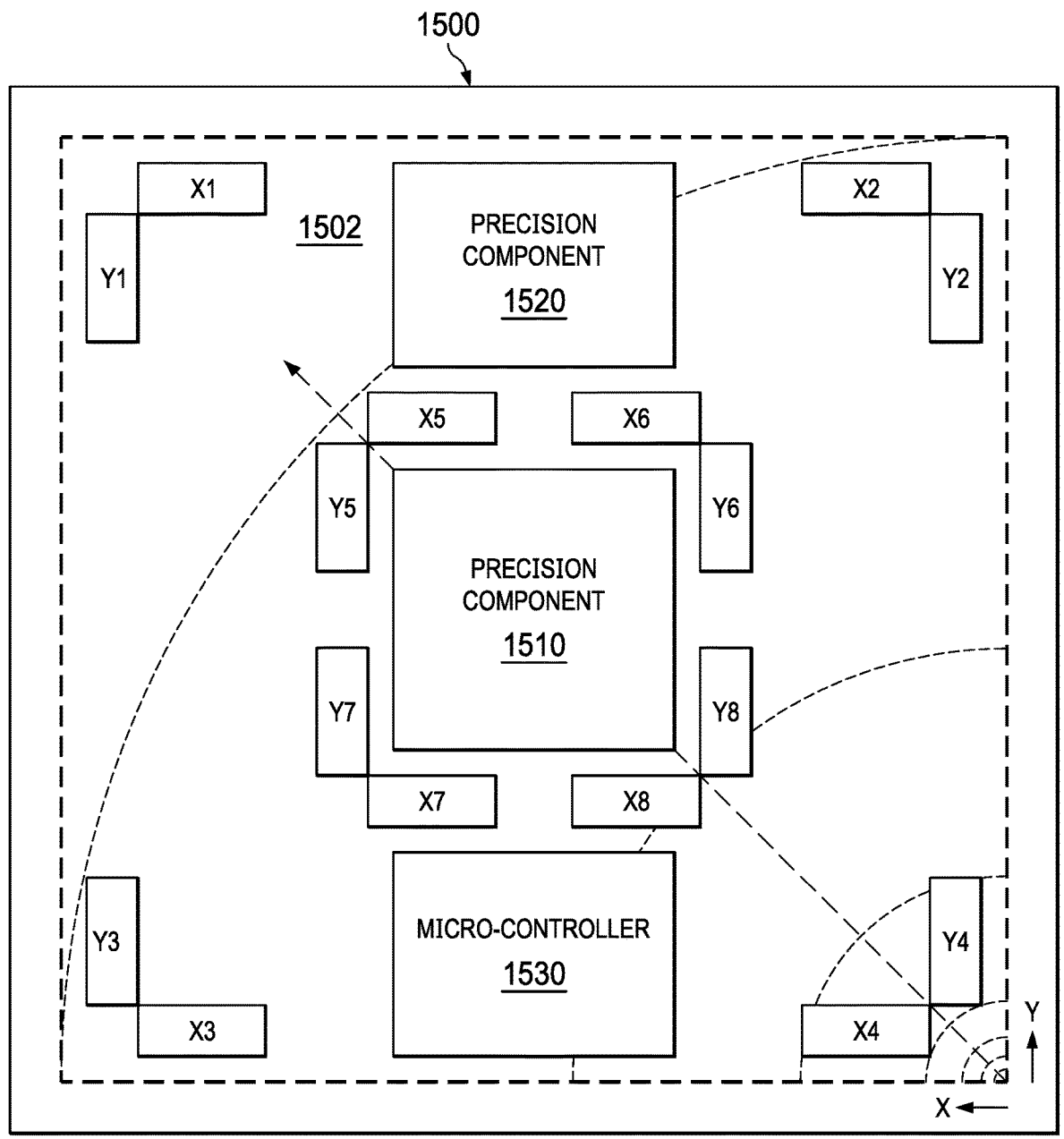
FIG. 15 is a layout diagram showing an example stress gradient of an example integrated circuit formed on a semiconductor substrate.

FIG. 15 is a layout diagram showing an example stress gradient of an example integrated circuit formed on a semiconductor substrate. The integrated circuit 1500 is an example integrated circuit that includes first-axis stress sensors X1-X8, second-axis stress sensors Y1-Y8, precision component 1510, precision component 1520, and a processor (e.g., at least one micro-controller 1530) coupled to the stress sensors and the precision components (e.g., so that the processor can receive indications of directional stress received by each stress sensor, and so that the processor can generate at least one compensating signal in response to the received stress indications and apply a compensation signal to a respective precision component). As described herein following, an example stress gradient is propagated through the first, second and third locations of the piezoelectric material, and one or more processors are arranged to determine a respective value for the stress gradient at each of the locations in response to a respective indication of at least one stress vector received from a respective stress sensor.

The integrated circuit 1500 includes a stress gradient 1502, which can form in response to a packaging operation (which can include a process imperfection that can result in unevenly distributed mounting stresses) and/or thermal cycling (which can include heat generated by electric components and/or differences in thermal expansion of substances applied at various stages of a manufacturing/packaging process). The amount of stress exerted by an applied force can "fall off" with the square of the distance from the point at which the applied force is applied. Moreover, various stresses can be applied from different locations and with different orientations and can dynamically change during an operation of the integrated circuit (and can also change over the lifecycle of the device for similar operating conditions).

In an example, the stress gradient 1502 can result in response to: mounting, at a first temperature, the integrated circuit 1500 on an IC package (or other chip carrier); a change in the first temperature; differences in thermal expansion between the IC package (not shown), the integrated circuit 1500, and/or adhesives/sealants disposed therebetween.

The processor is arranged to read indications from each of the stress sensors, where the locations (e.g., in Cartesian coordinates) and orientations of each sensor is predetermined (e.g., "known" by the processor). In operation: the processor can interpolate a stress of a first orientation for each point (e.g., location and/or quanta) across the surface of the integrated circuit 1500, the processor can interpolate a stress of a second orientation for each point across the surface of the integrated circuit 1500, and the processor can interpolate a stress of a third orientation for each point across the surface of the integrated circuit 1500. Accordingly, the stress gradient 1502 can include one, two, or three orientations of stress vectors (which can include shear vectors that can be non-orthogonally oriented with respect to one or more other orientations of stress vectors), and the processor can interpolate intermediate stresses for each of the measured dimensions (including the Z dimension, not shown in FIG. 15 for clarity).

The processor can interpolate intermediate stresses in response to received stress indications (for a given orientation) by linear interpolation (for faster processing) or by logarithmic interpolation or by other interpolating techniques such as cubic splines. The processor can determine the stress gradient at any of start of operation, at reset, periodically, or continually (e.g., as in a raster scanning manner).

The stresses affecting a performance parameter of a precision component can be more closely determined by (e.g., at design time) arranging the precision component (e.g., precision component 1510) to be adjacent to specific stress sensors (e.g., stress sensors X5-X8 and Y5-Y8). The stresses affecting a performance parameter of each various precision components can be determined in response to a given number of one or more stress sensors closest to a given precision component: for example, the stresses affecting a performance parameter of precision component 1520 can be determined in response to interpolating stress indications received from stress sensors X1, X5, X6 and X2 and Y1, Y5, Y6 and Y2. Accordingly, the accuracy of selected precision components can be compensated during operation in response to a relative importance of the criticality of each respective precision component.

In an example, the integrated circuit 1500 includes a substrate comprising a piezoelectric material having a crystal axis (e.g., axis X), a first piezo-resistive coefficient (e.g., $\pi_{LONG}$) having a first-axis orientation that is oriented with respect to the crystal axis, and a second piezo-resistive coefficient (e.g., $\pi_{TRAN}$ or $\pi_{VERT}$) having a second-axis orientation that is different from the first orientation.

In the example, the integrated circuit 1500 further includes the precision component 1510, which is formed on the substrate in a first location, and which includes a performance parameter that is affected by a stress vector exerted in the piezoelectric material.

In the example, the integrated circuit 1500 further includes a first stress sensor formed on the substrate in a second location, the first stress sensor being coupled to the precision component.

In the example, the integrated circuit 1500 further includes a second stress sensor formed on the substrate in a third location, the second stress sensor being coupled to the precision component.

In the example, the integrated circuit 1500 further includes a processor (e.g., at least one micro-controller 1530) coupled to the precision component 1510, the first stress sensor, the second stress sensor, and is arranged to generate a compensation quantity in response to an output of the first stress sensor and an output of the second stress sensor, and in response to the first location, the second location, and the third location, wherein the compensation quantity is applied to the precision component so that an output signal of the precision component 1510 that is affected by the performance parameter is compensated in response to the compensation quantity.

In a further example, the processor is arranged to generate the compensation quantity in response to a stress gradient extending through the first, second and third locations of the piezoelectric material of the substrate, wherein at least one value for a stress gradient at the first location is determined in response to an indication of at least one stress vector received from the first stress sensor and in response to an indication of at least one stress vector received from the second stress sensor.

An example method of certain techniques described herein includes: arranging a precision component (e.g., which can be included by a precision device 220 or a trimmable resistor that can be calibrated to restrict or otherwise control a current) on a piezoelectric material, wherein the piezoelectric material (e.g., 200) has a crystal axis (e.g., axis X), a first piezo-resistive coefficient (e.g., $\pi_{LONG}$) having a first-axis orientation that is oriented with respect to (e.g., longitudinal to) the crystal axis, and a second piezo-resistive coefficient (e.g., $\pi_{TRAN}$) having a second-axis orientation that is different from (e.g., transverse to) the first orientation; arranging a precision component (e.g., 1220) on the piezoelectric material, wherein the precision component includes at least one performance parameter that is affected by a stress exerted in the piezoelectric material; arranging a first-axis stress sensor (e.g., 210, Rsense_xa) on the piezoelectric material and electrically coupled to the precision component, wherein the first-axis stress sensor includes a first-axis stress sensing resistor (e.g., $XR_{LONG}$) coupled in series with a second-axis stress sensing resistor (e.g., $XR_{TRAN}$ or $XR_{VERT}$), the first-axis stress sensing resistor including first-axis conductors arranged along (e.g., longitudinal to) the crystal axis and the second-axis stress sensing resistor including second-axis conductors arranged transverse to the crystal axis, wherein a ratio of a resistance of the first stress sensing resistor to the second stress sensing resistor is directly proportional to the ratio of the first piezo-resistive coefficient to the second piezo-resistive coefficient; generating, by the first-axis stress sensor, a first-axis sensing signal in response to a first-axis resultant of the stress exerted in the piezoelectric material; and generating, by a compensating circuit (e.g., compensating circuit 240 or signal conditioner 420), an analog compensating signal in response to an analog signal received from a to-be-compensated circuit and the first-axis sensing signal.

An example method of certain techniques described herein can further include comprising calibrating the precision component (e.g., trimmable resistor) to limit a current of the first stress sensor to reduce an effect of the exerted stress upon the at least one performance parameter of the analog to-be-compensated circuit.

Modifications are possible in the described embodiments, and other embodiments are possible, within the scope of the claims.

What is claimed is:

1. A circuit comprising:
a sense resistor having a first resistance that reflects a stress along a particular axis;
a calibrated resistor having a second resistance; and
a compensating circuit having an input terminal and an output terminal, the input terminal coupled to at least one of the sense resistor or to the calibrated resistor, and the compensating circuit configured to provide a compensation signal at the output terminal based on the first resistance and the second resistance.

2. The circuit of claim 1, wherein:
the sense resistor includes a first segment and a second segment orthogonal to the first segment, the first segment parallel to the particular axis;
the first segment has a first piezo-resistive coefficient and a first length;
the second segment has a second piezo-resistive coefficient and a second length; and a first ratio between the first and second lengths is based on a second ratio between the first and second piezo-resistive coefficients.

3. The circuit of claim 1, wherein:
the sense resistor is a first sense resistor;
the stress is a first stress;
the particular axis is a first axis;
the calibrated resistor is a first calibrated resistor;
the input terminal is a first input terminal;
the output terminal is a first output terminal; and
the circuit further comprises:
a second sense resistor having a third resistance that reflects a second stress along a second axis; and
a second calibrated resistor having a fourth resistance; and
the compensating circuit having a second input terminal and a second output terminal, the second input terminal coupled to the second sense resistor and the second calibrated resistor configured to provide a second compensation signal at the second output terminal based on the third resistance and the fourth resistance.

4. The circuit of claim 3, further comprising a substrate having a surface, wherein the first axis is parallel to the surface, and the second axis is perpendicular to the surface.

5. The circuit of claim 1, wherein:
the calibrated resistor is coupled between a first power terminal and the input terminal; and
the sense resistor is coupled between the input terminal and a second power terminal.

6. The circuit of claim 5, wherein:
the sense resistor is a first sense resistor;
the stress is a first stress;
the calibrated resistor is a first calibrated resistor;
the input terminal is a first input terminal, and the compensating circuit has a second input terminal;
the circuit further comprises:
a second sense resistor having a third resistance that reflects a second stress along the particular axis; and
a second calibrated resistor having a fourth resistance;
the second sense resistor is coupled between the first power terminal and the second input terminal; and
the second calibrated resistor is coupled between the second input terminal and the second power terminal.

7. The circuit of claim 6, wherein the first and second sense resistors and the first and second calibrated resistor are part of a Wheatstone bridge.

8. The circuit of claim 6, wherein the compensating circuit includes:
an amplifier having first and second amplifier inputs and an amplifier output, the first amplifier input coupled to the first input terminal, the second amplifier input coupled to the second input terminal, and the amplifier output is coupled to the output terminal; and
a feedback resistor coupled between one of the first amplifier input and the amplifier output.

9. The circuit of claim 6, wherein a portion of the calibrated resistor is located between a portion of the first sense resistor and a portion of the second sense resistor.

10. The circuit of claim 1, further comprising a digital signal processor (DSP) having an input terminal coupled to the output terminal of the compensating circuit.

11. The circuit of claim 1, wherein the input terminal is a first input terminal, the compensating circuit has a second input terminal and the compensating circuit further configured to provide the compensation signal at the output terminal responsive to a first signal at the second input terminal.

12. The circuit of claim 11, wherein the first signal includes at least one of a reference signal or a temperature signal.

13. The circuit of claim 11, wherein the compensating circuit includes:
an amplifier having first and second amplifier inputs and an amplifier output, the first amplifier input coupled to the first input terminal, and the second amplifier input coupled to the second input terminal;
a first current source having a first current control input and a first current output, the first current control input coupled to the amplifier output, and the first current output coupled to the calibrated resistor; and
a second current source having a second current control input and a second current output, the second current control input coupled to the amplifier output, and the second current output coupled to the output terminal of the compensation circuit and to the sense resistor.

14. The circuit of claim 11, wherein the compensating circuit includes:
an amplifier having first and second amplifier inputs and an amplifier output, the first amplifier input coupled to the first input terminal, the second amplifier input coupled to the second input terminal, and the amplifier output coupled to the output terminal of the compensation circuit,
wherein the calibrated resistor is coupled between the first input terminal and a ground terminal, and the sense resistor is coupled between the first input terminal and the amplifier output.

15. The circuit of claim 11, wherein the compensating circuit includes:
an amplifier having first and second amplifier inputs and an amplifier output, the first amplifier input coupled to the first input terminal and to the sense resistor, and the second amplifier input coupled to the second input terminal;
a first current source having a first current control input and a first current output, the first current control input coupled to the amplifier output, and the first current output coupled to the calibrated resistor; and
a second current source having a second current control input and a second current output, the second current control input coupled to the amplifier output, and the second current output coupled to the output terminal of the compensation circuit.

16. The circuit of claim 15, further comprising a reference generation circuit having a reference output coupled to the output terminal of the compensating circuit.

17. A system, comprising:
a stress sensor configured to sense a stress along a particular axis;
a calibrated resistor having a resistance; and
a processor coupled to the calibrated resistor and to the stress sensor, the processor configured to:
receive a first signal from the calibrated resistor;
receive a second signal from the stress sensor indicative of the stress along the particular axis; and
generate a stress compensated version of the first signal based on the second signal.

18. The system of claim 17, wherein the calibrated resistor is at a first location, the stress sensor is a first stress sensor at a second location, and the system further comprises a second stress sensor at a third location, the processor coupled to the second stress sensor and the processor configured to receive a third signal from the second stress sensor and generate the stress compensated version of the first signal in response to a stress gradient along the first, second, and third locations reflected in the second and third signals.

19. The system of claim 17, wherein:
the stress sensor includes a resistor, the resistor including a first segment and a second segment orthogonal to the first segment, the first segment parallel to the particular axis;
the first segment has a first piezo-resistive coefficient and a first length;
the second segment has a second piezo-resistive coefficient and a second length; and
a first ratio between the first and second lengths is based on a second ratio between the first and second piezo-resistive coefficients.

20. A method, comprising:
generating a first signal using a calibrated resistor, in which the calibrated resistor has a first resistance; and
generating a compensation signal based on the first resistance of the calibrated resistor and a second resistance of a sense resistor, in which the second resistance reflects a stress along a particular axis.

21. The method of claim 20, further comprising:
receiving a second signal from a circuit; and
generating a stress compensated version of the second signal based on combining the second signal and the compensation signal.

22. The method of claim 20, wherein:
the sense resistor includes a first segment and a second segment orthogonal to the first segment, the first segment parallel to the particular axis;
the first segment has a first piezo-resistive coefficient and a first length;
the second segment has a second piezo-resistive coefficient and a second length; and
a first ratio between the first and second lengths is based on a second ratio between the first and second piezo-resistive coefficients.

* * * * *